United States Patent
Wood et al.

(10) Patent No.: US 7,579,267 B2
(45) Date of Patent: *Aug. 25, 2009

(54) METHODS AND SYSTEMS FOR FABRICATING SEMICONDUCTOR COMPONENTS WITH THROUGH WIRE INTERCONNECTS (TWI)

(75) Inventors: Alan G. Wood, Boise, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/712,815

(22) Filed: Mar. 1, 2007

(65) Prior Publication Data

US 2007/0167000 A1    Jul. 19, 2007

Related U.S. Application Data

(62) Division of application No. 11/296,057, filed on Dec. 7, 2005, now Pat. No. 7,307,348.

(51) Int. Cl.
*H01L 23/48* (2006.01)
(52) U.S. Cl. .................. 438/617; 438/637
(58) Field of Classification Search .............. 257/774; 438/617, 637, 639, 640
See application file for complete search history.

(56) References Cited

U.S. PATENT DOCUMENTS

| | | | |
|---|---|---|---|
| 3,761,782 | A | 9/1973 | Youmans |
| 4,348,253 | A | 9/1982 | Subbarao et al. |
| 4,394,712 | A | 7/1983 | Anthony |
| 4,710,795 | A | 12/1987 | Nippert et al. |

(Continued)

FOREIGN PATENT DOCUMENTS

TW    516194    1/2003

(Continued)

OTHER PUBLICATIONS

International Technology Roadmap for Semiconductors, 2005 Edition, Assembly and Packaging, pp. 1-44.

(Continued)

*Primary Examiner*—Roy K Potter
(74) *Attorney, Agent, or Firm*—Stephen A. Gratton

(57) ABSTRACT

A semiconductor component includes a semiconductor substrate having a substrate contact, and a through wire interconnect (TWI) bonded to the substrate contact. The through wire interconnect (TWI) includes a via through the substrate contact and the substrate, a wire in the via bonded to the substrate contact, and a contact on the wire. A stacked semiconductor component includes the semiconductor substrate, and a second semiconductor substrate stacked on the substrate and bonded to a through wire interconnect on the substrate. A method for fabricating a semiconductor component with a through wire interconnect includes the steps of providing a semiconductor substrate with a substrate contact, forming a via through the substrate contact and part way through the substrate, placing the wire in the via, bonding the wire to the substrate contact, and then thinning the substrate from a second side to expose a contact on the wire. A system for fabricating the semiconductor component includes a bonding capillary configured to place the wire in the via, and to form a bonded connection between the wire and the substrate contact.

59 Claims, 21 Drawing Sheets

U.S. PATENT DOCUMENTS

| | | |
|---|---|---|
| 4,808,273 A | 2/1989 | Hua et al. |
| 4,897,708 A | 1/1990 | Clements |
| 5,229,647 A | 7/1993 | Gnadinger |
| 5,432,999 A | 7/1995 | Capps |
| 5,495,667 A | 3/1996 | Farnworth et al. |
| 5,503,285 A | 4/1996 | Warren |
| 5,519,332 A | 5/1996 | Wood et al. |
| 5,649,981 A | 7/1997 | Arnold et al. |
| 5,674,785 A | 10/1997 | Akram et al. |
| 5,686,352 A | 11/1997 | Higgins, III |
| 5,824,569 A | 10/1998 | Brooks et al. |
| 5,840,199 A | 11/1998 | Warren |
| 5,852,871 A | 12/1998 | Khandros |
| 5,950,070 A | 9/1999 | Razon et al. |
| 6,002,177 A | 12/1999 | Gaynes et al. |
| 6,033,614 A | 3/2000 | Bolken et al. |
| 6,043,564 A | 3/2000 | Brooks et al. |
| 6,100,175 A | 8/2000 | Wood et al. |
| 6,184,587 B1 | 2/2001 | Khandros et al. |
| 6,235,554 B1 | 5/2001 | Akram et al. |
| 6,251,703 B1 | 6/2001 | Van Campenhout et al. |
| 6,326,689 B1 | 12/2001 | Thomas |
| 6,368,896 B2 | 4/2002 | Farnworth et al. |
| 6,395,581 B1 | 5/2002 | Choi |
| 6,435,200 B1 | 8/2002 | Langen |
| 6,437,254 B1 | 8/2002 | Crudo |
| 6,444,576 B1 | 9/2002 | Kong |
| 6,465,877 B1 | 10/2002 | Farnworth et al. |
| 6,494,221 B1 | 12/2002 | Sellmer et al. |
| 6,528,984 B2 | 3/2003 | Beaman et al. |
| 6,566,747 B2 | 5/2003 | Ohuchi et al. |
| 6,569,762 B2 | 5/2003 | Kong |
| 6,577,013 B1 | 6/2003 | Glenn et al. |
| 6,582,992 B2 | 6/2003 | Poo et al. |
| 6,600,221 B2 | 7/2003 | Kimura |
| 6,601,888 B2 | 8/2003 | McIlwraith et al. |
| 6,605,551 B2 | 8/2003 | Wermer et al. |
| 6,611,052 B2 | 8/2003 | Poo et al. |
| 6,614,104 B2 | 9/2003 | Farnworth et al. |
| 6,653,170 B1 | 11/2003 | Lin |
| 6,724,074 B2 | 4/2004 | Song et al. |
| 6,727,116 B2 | 4/2004 | Poo et al. |
| 6,731,013 B2 | 5/2004 | Juso et al. |
| 6,740,582 B2 | 5/2004 | Siniaguine |
| 6,740,960 B1 | 5/2004 | Farnworth |
| 6,812,549 B2 | 11/2004 | Umetsu et al. |
| 6,833,317 B2 | 12/2004 | Forbes et al. |
| 6,833,612 B2 | 12/2004 | Kinsman |
| 6,848,177 B2 | 2/2005 | Swann et al. |
| 6,858,092 B2 | 2/2005 | Langen |
| 6,881,648 B2 | 4/2005 | Chen et al. |
| 6,882,057 B2 | 4/2005 | Hsu |
| 6,896,170 B2 | 5/2005 | Lyn et al. |
| 6,906,418 B2 | 6/2005 | Hiatt et al. |
| 6,908,784 B1 | 6/2005 | Farnworth |
| 6,933,524 B2 | 8/2005 | Hembree et al. |
| 6,936,913 B2 | 8/2005 | Akerling et al. |
| 6,952,054 B2 | 10/2005 | Akram et al. |
| 6,954,000 B2 | 10/2005 | Hembree |
| 6,964,915 B2 | 11/2005 | Farnworth et al. |
| 6,998,344 B2 | 2/2006 | Akram et al. |
| 6,998,717 B2 | 2/2006 | Farnworth et al. |
| 7,029,949 B2 | 4/2006 | Farnworth et al. |
| 7,060,526 B2 | 6/2006 | Farnworth et al. |
| 7,078,266 B2 | 7/2006 | Wood et al. |
| 7,078,922 B2 | 7/2006 | Kirby |
| 7,108,546 B2 | 9/2006 | Miller et al. |
| 7,112,469 B2 | 9/2006 | Mihara |
| 7,119,001 B2 | 10/2006 | Kang |
| 7,132,731 B2 | 11/2006 | Wood et al. |
| 7,180,149 B2 | 2/2007 | Yamamoto et al. |
| 7,307,348 B2 | 12/2007 | Wood et al. |
| 7,371,676 B2 * | 5/2008 | Hembree ............... 438/617 |
| 7,393,770 B2 | 7/2008 | Wood et al. |
| 2002/0017710 A1 | 2/2002 | Kurashima et al. |
| 2002/0117330 A1 | 8/2002 | Eldridge et al. |
| 2003/0230805 A1 | 12/2003 | Noma et al. |
| 2003/0232460 A1 | 12/2003 | Poo et al. |
| 2004/0235270 A1 | 11/2004 | Noma et al. |
| 2005/0029650 A1 | 2/2005 | Wood et al. |
| 2005/0082654 A1 | 4/2005 | Humpston et al. |
| 2005/0205951 A1 | 9/2005 | Eskridge |
| 2006/0017177 A1 | 1/2006 | Seng |
| 2006/0163679 A1 | 7/2006 | LaFond et al. |
| 2006/0228825 A1 | 10/2006 | Hembree |
| 2006/0289992 A1 | 12/2006 | Wood |
| 2007/0126091 A1 | 6/2007 | Wood et al. |
| 2007/0138498 A1 | 6/2007 | Zilber et al. |
| 2007/0200255 A1 | 8/2007 | Hembree |
| 2007/0202617 A1 | 8/2007 | Hembree |
| 2007/0222054 A1 | 9/2007 | Hembree |
| 2007/0246819 A1 | 10/2007 | Hembree |
| 2008/0038868 A1 | 2/2008 | Leib |
| 2008/0042247 A1 | 2/2008 | Wood et al. |
| 2008/0203539 A1 | 8/2008 | Wood et al. |
| 2008/0206990 A1 | 8/2008 | Wood et al. |
| 2008/0229573 A1 | 9/2008 | Wood et al. |

FOREIGN PATENT DOCUMENTS

TW 571420 1/2004

OTHER PUBLICATIONS

Renesas, Hitachi and Renesas Technology Develop Through-Hole Electrode Technology to Enable Interconnection of Stacked Chips at Room Temperature, News Release, Jun. 1, 2005, pp. 1-2.

Ivy Wei Qin et al., "Automatic Wedge Bonding with Ribbon Wire For High Frequency Applications", Semicon West, 2002 SEMI, pp. 1-11.

Dr. Ning-Cheng Lee, "The Use of Solder as an Area-Array Package Interconnect", Chip Scale Review, Sep.-Oct. 1999, pp. 1-8. Available on line: www.chipscalereview.com/issues/.

Indium Corporation of America, Product Data sheet, "Pb-Free Solder Fabrication", pp. 1-2, date unavailable.

Kulicke & Soffa, Dispense/UV/ Cure Kit for NOSWEEP™, advertising, 2004, pp. 1-2. Available on line:www.kns.com.

George A. Riley, PhD., Flipchips dot.com. Tutorial 37, "Too much gold can be a bad thing", Mar. 24, 2005, pp. 1-3. Available on line: www.flip[chips.com/tutoria137.html.

Leon Oboler, "Still at the Head of the Class", Chip Scale Review, Internet article, Jul./Aug. 1999, pp. 1-7.

IBM and Suss announce semiconductor technology agreement, Sep. 13, 2004, pp. 1-2.

IBM Research & IBM Systems and Technology Group, C4NP Technology for lead- free wafer bumping, internet article, Sep. 2004, pp. 1-13.

Office Action dated Oct. 17, 2007 from U.S. Appl. No. 11/102,408 (US Patent No. 7,371,676).

Office Action dated Jul. 11, 2007 from U.S. Appl. No. 11/102,408 (US Patent No. 7,371,676).

Notice of Allowance dated Jan. 07, 2008 from U.S. Appl. No. 11/102,408 (US Patent No. 7,371,676).

Office Action dated Jun. 04, 2007 from U.S. Appl. No. 11/296,057 (US Patent No. 7,307,348).

Notice of Allowance dated Mar. 08, 2007 from U.S. Appl. No. 11/296,057 (US Patent No. 7,307,348).

Office Action dated Nov. 14, 2008 from U.S. Appl. No. 11/712,815.

Office Action dated Oct. 31, 2007 from U.S. Appl. No. 11/133,085 (US Patent No. 7,393,770).

Office Action dated Feb. 11, 2008 from U.S. Appl. No. 11/133,085 (US Patent No. 7,393,770).

Notice of Allowance dated Mar. 05, 2008 from U.S. Appl. No. 11/133,085 (us Patent No. 7,393,770).

Office Action dated Mar. 12, 2009 from U.S. Appl. No. 11/409,638.

PCT Search Report from International Application No. PCT/US2006/010044 dated Nov. 7, 2007.
PCT Search Report from International Application No. PCT/US2007/002336 dated Feb. 13, 2008.
PCT Search Report from International Application No. PCT/US2006//017036 dated May 2, 2007.

* cited by examiner

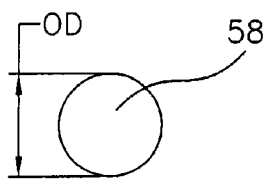
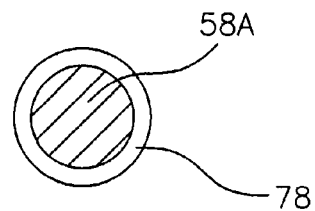
FIGURE 3G          FIGURE 3H
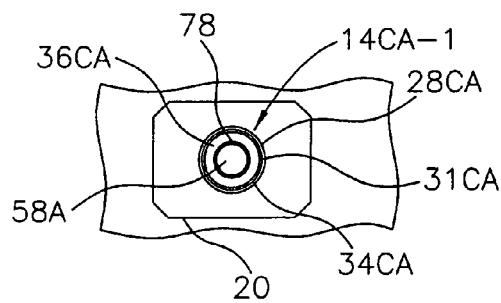
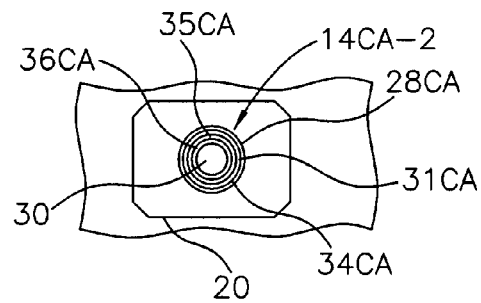
FIGURE 3I          FIGURE 3J
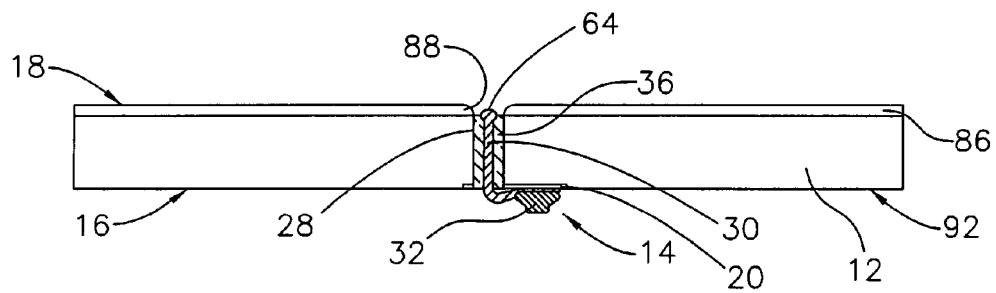
FIGURE 4A
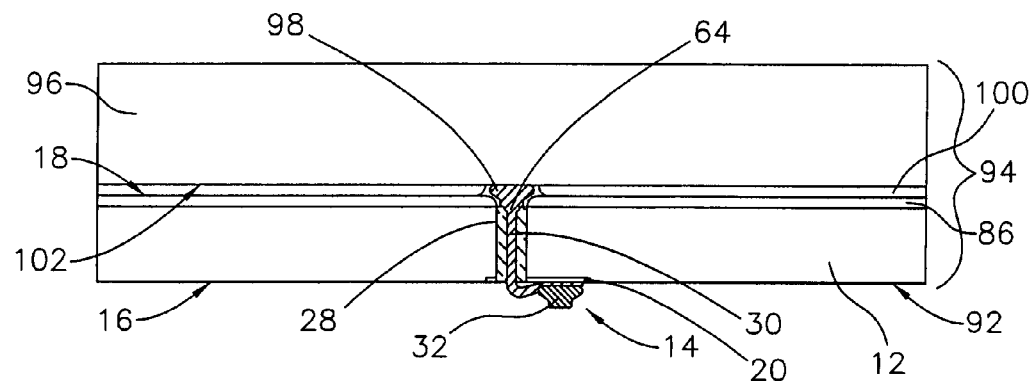
FIGURE 4B

METHODS AND SYSTEMS FOR FABRICATING SEMICONDUCTOR COMPONENTS WITH THROUGH WIRE INTERCONNECTS (TWI)

CROSS REFERENCE TO RELATED APPLICATIONS

This application is a division of Ser. No. 11/296,057 filed Dec. 7, 2005, Pat. No. 7,307,348 B2. This application is related to application Ser. No. 11/102,408, filed Apr. 8, 2005, Pat. No. 7,371,676 B2 to application Ser. No. 11/743,636, filed May 2, 2007, Publication No. U.S. 2007/0202617 A1; to application Ser. No. 11/743,660, filed May 2, 2007, Publication No. U.S. 2007/0222054 A1; to application Ser. No. 11/743,689, filed May 3, 2007, Publication No. U.S. 2007/0200255 A1; to application Ser. No. 11/296,057, filed Dec. 7, 2005, Pat. No. 7,307,348 B2; to application Ser. No. 11/859,776, filed Sep. 23, 2007, Publication No. U.S. 2008/0042247 A1; to application Ser. No. 11/133,085, filed May 19,2005, Pat. No. 7,393,770 B2; to application Ser. No. 12/114,757, filed May 3, 2008, Publication No. U.S. 2008/0203539 A1; to application Ser. No. 12/114,761, filed May 3, 2008, Publication No. U.S. 2008/0229573 A1; to application Ser. No. 12/117,919, filed May 9, 2008, Publication No. U.S. 2008/0206990 A1; and to application Ser. No. 11/409,638, filed Apr. 24, 2006, Publication No. U.S. 2007/0246819.

BACKGROUND OF THE INVENTION

As semiconductor components become smaller and have more complicated input/output configurations, different types of interconnects have been developed for implementing different signal transmission systems to and from the integrated circuits contained on the components. For example, surface interconnects, such as redistribution conductors can be formed on a particular surface, such as on a face or a back side of a semiconductor component. Via interconnects, such as metal filled vias, can be used to electrically connect electrical elements, such as terminal contacts or bond pads, on opposing surfaces of a semiconductor component. Wire interconnects, such as wires bonded to bond pads, can be used to electrically connect a semiconductor component to mating contacts on a supporting substrate, such as a package substrate, a module substrate, or a PCB. Bump interconnects, such as solder balls or bumps, can be used to mount a semiconductor component in a flip chip configuration to a supporting substrate.

In fabricating semiconductor components, interconnects having a high electrical conductivity, and a low parasitic capacitance, provide the best performance for a signal transmission system. In addition, for fabricating semiconductor components, particularly chip scale components, it is advantageous for interconnects to be capable of fabrication in dense configurations using conventional equipment and techniques. In general, conventional interconnects have limitations on conductivity, capacitance, density and manufacture. For example, deposited conductors can have a low electrical resistivity. Wire interconnects can have a low capacitance, but require additional space for looping and bonding, and require protective structures such as encapsulants.

It is also advantageous for interconnects to have the capability to electrically connect multiple semiconductor substrates in a stacked configuration. For example, a stacked semiconductor component can include multiple stacked semiconductor substrates (e.g., dice) having integrated circuits in a desired electrical configuration, such as memory, processing or imaging. Conventional interconnects also have limitations on their ability to form stacked semiconductor components. For example, wire interconnects are generally not used to make electrical connections between stacked substrates.

In view of the limitations of conventional interconnects, it would be advantageous for an interconnect to have new and different features which overcome some of these limitations. However, the foregoing examples of the related art and limitations related therewith, are intended to be illustrative and not exclusive. Other limitations of the related art will become apparent to those of skill in the art upon a reading of the specification and a study of the drawings.

SUMMARY OF THE INVENTION

The following embodiments and aspects thereof are described and illustrated in conjunction with components, methods, materials and systems, which are meant to be exemplary and illustrative, not limiting in scope. In various embodiments, one or more of the above described limitations, have been reduced or eliminated, while other embodiments are directed to other improvements.

A semiconductor component includes a semiconductor substrate having a substrate contact on a first side (circuit side), an integrated circuit in electrical communication with the substrate contact, and a through wire interconnect (TWI) bonded to the substrate contact. The through wire interconnect (TWI) includes a via through the substrate contact and through the substrate to a second side (back side) thereof, a wire in the via bonded to the substrate contact, and a contact on the wire accessible from the second side of the substrate. A bonded connection between the wire and the substrate contact can comprise a ball bond, a wedge bond, a ribbon bond, or a compressed flange bond.

The through wire interconnect (TWI) also includes a bonding member on the substrate contact and the wire, configured to secure the wire to the substrate contact, and provide a bonding structure for bonding to the through wire interconnect (TWI) to other components. The through wire interconnect (TWI) also includes a dielectric material in the via surrounding and electrically insulating the wire. The semiconductor component can be used to fabricate stacked semiconductor components, wherein through wire interconnects (TWI) provide signal transmission structures, and bonding structures between adjacent stacked components as well.

A stacked semiconductor component includes a semiconductor substrate, and at least one second semiconductor substrate stacked on the semiconductor substrate, and bonded to a through wire interconnect on the semiconductor substrate. In addition, the stacked semiconductor component can be constructed as an integrated system, wherein each semiconductor substrate performs a different electrical function in the stacked semiconductor component (e.g., memory, processing, imaging etc.). A redistribution layer RDL semiconductor component includes a terminal contact on a semiconductor substrate in electrical communication with a through wire interconnect on the semiconductor substrate.

Another stacked semiconductor component includes a plurality of stacked semiconductor substrates having bonded through wire interconnects on adjacent substrates. A wire bonded semiconductor component includes a package substrate, and a semiconductor substrate having a through wire interconnect wire bonded to the package substrate. A flip chip semiconductor component includes a package substrate, and a semiconductor substrate having a through wire interconnect flip chip bonded to the package substrate. A face to face stacked semiconductor component includes two components in a face to face configuration with terminal contacts on opposing sides. A back to back stacked semiconductor component includes two components in a back to back configuration with terminal contacts on opposing sides. With any stacked semiconductor component, at least some of the through wire interconnects can include electrically isolated substrate contacts, configured to reduce capacitance and noise on signals transmitted through the stacked semiconductor component.

A method for fabricating a semiconductor component with a through wire interconnect includes the steps of providing a semiconductor substrate with a substrate contact, forming a via through the substrate contact and part way through the substrate, placing the wire in the via, and bonding the wire to the substrate contact. The method also includes the steps of placing a dielectric material in the via, thinning the substrate from a second side to expose at least a portion of the wire to form a contact, and forming a bonding member on the wire and the substrate contact.

A system for fabricating a semiconductor component includes a semiconductor substrate having an integrated circuit, a substrate contact in electrical communication with the integrated circuit. The system also includes an etching system configured to form a via in the substrate contact and part way through the substrate. The system also includes a wire bonding apparatus configured to place the wire in the via, and to bond the wire to the substrate contact. The system also includes a thinning apparatus configured to thin the semiconductor substrate to expose at least a portion of the wire in the via.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

FIG. 3G is an enlarged schematic cross sectional view taken along section line 3G-3G of FIG. 2D illustrating a bonding wire used in the fabrication of through wire interconnects;

FIG. 3H is an enlarged schematic cross sectional view equivalent to FIG. 3G illustrating an alternate embodiment insulated bonding wire;

FIGS. 3I and 3J are schematic cross sectional views illustrating alternate embodiment co-axial through wire interconnects;

FIG. 4A is a schematic cross sectional view of a semiconductor component constructed using the method of FIGS. 2A-2P;

FIG. 4B is a schematic cross sectional view of a stacked semiconductor component constructed using the semiconductor component of FIG. 4A;

DETAILED DESCRIPTION OF THE PREFERRED EMBODIMENTS

As used herein, "semiconductor component" means an electronic element that includes a semiconductor substrate. "Semiconductor substrate" means an electronic element, such as a semiconductor die, or a semiconductor package that includes integrated circuits and semiconductor devices. "Interconnect" means an electrical element which electrically connects different electrical elements and transmits signals between these elements. "Wafer-level" means a process conducted on an element, such as a semiconductor wafer, containing multiple semiconductor substrates. "Die level" means a process conducted on a singulated element, such as a singulated semiconductor die or package. "Chip scale" means having an outline about the same as that of a semiconductor die. "Wafer size" means having an outline about the same as that of a semiconductor wafer.

Referring to FIGS. 1A-1D, a semiconductor component 10 (FIG. 1A) is illustrated. The semiconductor component 10 (FIG. 1A) includes a semiconductor substrate 12 (FIG. 1B) and a plurality of through wire interconnects 14 (FIG. 1B) on the semiconductor substrate 12.

The semiconductor substrate 12 (FIG. 1B) can comprise a conventional semiconductor die, or a thinned semiconductor die, having integrated circuits 22 (FIG. 1D) constructed in a desired electrical configuration using active semiconductor devices such as transistors. For example, the semiconductor substrate 12 (FIG. 1B) can comprise a high speed digital logic device, such as a dynamic random access memory (DRAM), a static random access memory (SRAM), a flash memory, a microprocessor, a digital signal processor (DSP), or an application specific integrated circuit (ASIC). In addition, the semiconductor substrate 12 (FIG. 1B) can comprise a tested die that has been certified as a known good die.

Figure 1A:
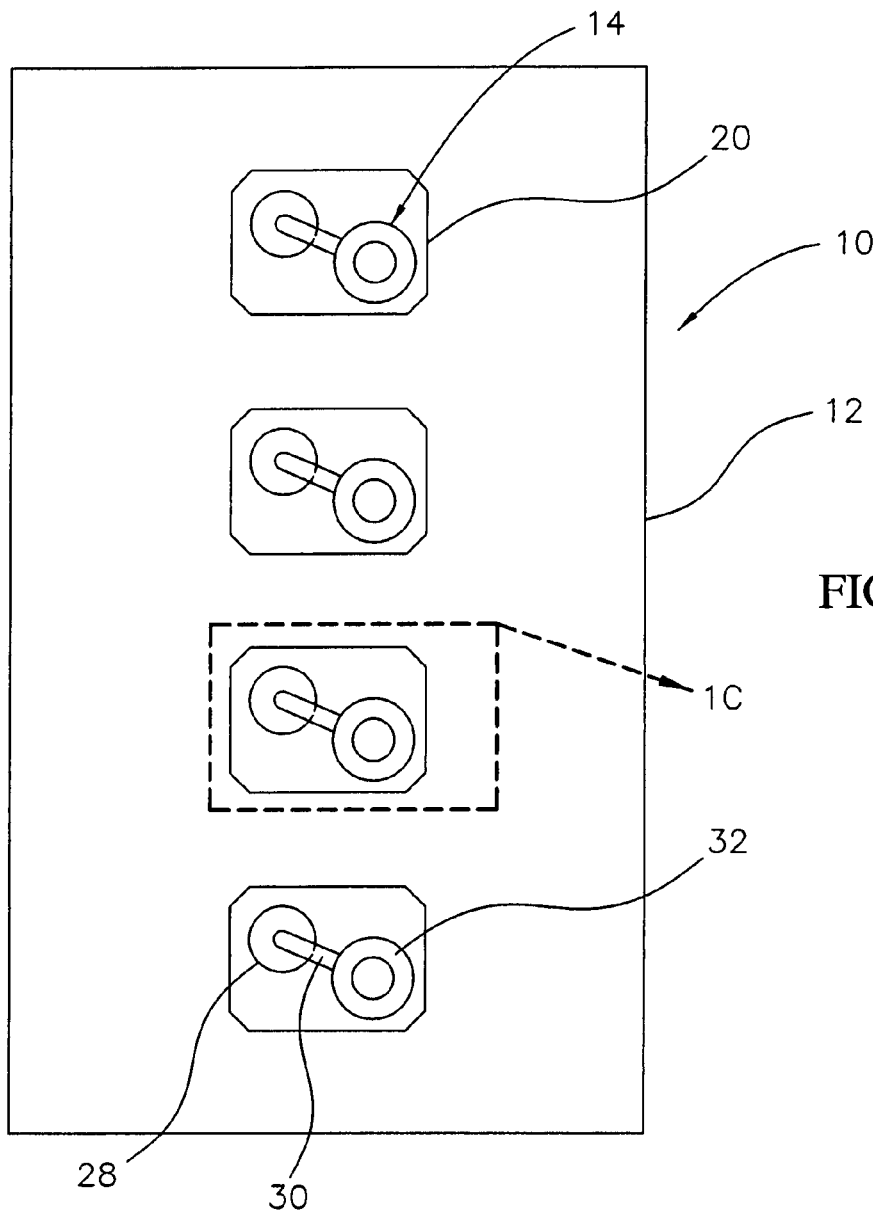
FIG. 1A is a schematic plan view of a semiconductor component having through wire interconnects.
Figure 1B:
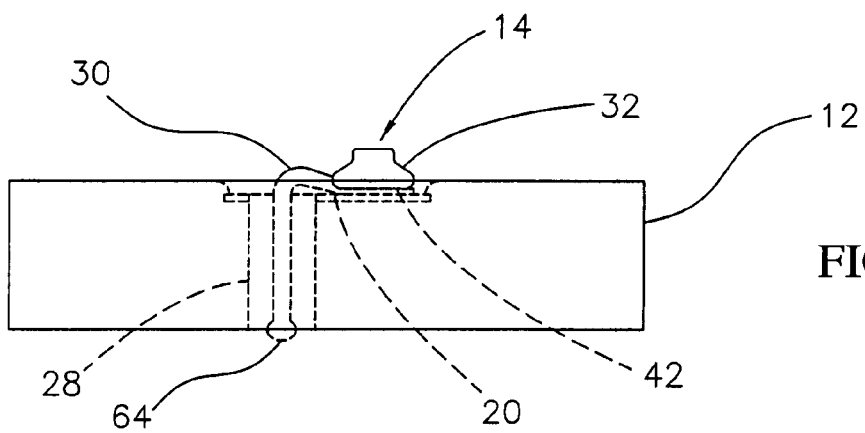
FIG. 1B is a schematic side elevation view of the semiconductor component of FIG. 1A.

As shown in FIG. 1A, in the illustrative embodiment, the semiconductor substrate 12 is a generally rectangular shaped die having opposed lateral edges and opposed longitudinal edges. However, the semiconductor substrate 12 (FIG. 1A) can have any polygonal shape, such as square or triangular, and can also have a circular or oval shape. In addition, the semiconductor substrate 12 can comprise a full thickness semiconductor die or a thinned semiconductor die. As shown in FIG. 1D, the semiconductor substrate 12 includes a circuit side 16 ("first side" in some of the claims), and a back side 18 ("second side in some of the claims).

As also shown in FIG. 1A, the semiconductor substrate 12 includes a plurality of substrate contacts 20 on the circuit side 16, which in the illustrative embodiment comprise the device bond pads. Alternately, rather than being the device bond pads, the substrate contacts 20 can comprise redistribution contacts (i.e., contacts formed in conjunction with a redistribution layer (RDL)). In addition, the substrate contacts 20 can comprise a highly-conductive, wire-bondable metal, such as aluminum or copper. The substrate contacts 20 can also comprise stacks of different metals, such as aluminum-nickel-gold, aluminum-nickel-solder, and copper-palladium.

As another alternative, at least some of the substrate contacts 20 (FIG. 1A) can comprise special purpose contacts formed specifically for constructing the through wire interconnects 14. For example, the substrate contacts 20 can comprise electrically isolated contacts, that are not in electrical communication with the integrated circuits 22 on the semiconductor substrate 12. As will be further explained, this concept can be employed in stacked components to reduce unwanted capacitance, noise, bleed off voltage and bleed off current.

For simplicity, the semiconductor substrate 12 (FIG. 1A) is illustrated with only four substrate contacts 20 (FIG. 1A) arranged in a single row. However, in actual practice the semiconductor substrate 12 (FIG. 1A) can include tens of substrate contacts 20 (FIG. 1A) arranged in a desired configuration, such as a center array, an edge array or an area array. Also in the illustrative embodiment, the substrate contacts 20 (FIG. 1A) have a generally rectangular peripheral outline and angled corners. However, as with the semiconductor substrate 12 (FIG. 1A), the substrate contacts 20 (FIG. 1A) can have any polygonal shape including square, circular, triangular and oval. In addition, a size of the substrate contacts 20 (FIG. 1C) can be selected as required. For example, each substrate contact 20 (FIG. 1C) can have a length (L) (FIG. 1C) of from about 50 μm to 200 μm and a width (W) (FIG. 1C) of from about 50 μm to 200 μm. Also in FIG. 1A, each substrate contact 20 has an associated through wire interconnect 14. However, the through wire interconnects 14 can also be formed on only selected substrate contacts 20. For example, only the substrate contacts 20 having a selected output or input configuration (e.g., Vss, Vcc) can be equipped with a through wire interconnect 14.

As shown in FIG. 1D, the substrate contacts 20 can be in electrical communication with internal conductors 24 located within the semiconductor substrate 12 proximate to the circuit side 16. In addition, the internal conductors 24 are in electrical communication with the integrated circuits 22 in the semiconductor substrate 12. The internal conductors 24 (FIG. 1D) can be part of the internal structure of the semiconductor substrate 12, and can comprise a highly conductive metal, such as aluminum or copper. Further, a die passivation layer 26 (FIG. 1D) proximate to the circuit side 16 protects the internal conductors 24 (FIG. 1D) and the integrated circuits 22 (FIG. 1D). The die passivation layer 26 (FIG. 1D) can comprise an electrically insulating material, such as BPSG (borophosphosilicate glass), a polymer or an oxide. In addition, the die passivation layer 26 (FIG. 1D) includes openings 44 (FIG. 1D) aligned with the substrate contacts 20 which provide access to the substrate contacts 20. All of the elements of the semiconductor substrate 12 including the integrated circuits 22 (FIG. 1D), the internal conductors 24 (FIG. 1D), and the die passivation layer 26 (FIG. 1D), can be formed using well known semiconductor fabrication processes.

As also shown in FIG. 1D, the through wire interconnect 14 includes a via 28 through the substrate contact 20 and the semiconductor substrate 12, a wire 30 in the via 28, a bonding member 32 on the wire 30 and the substrate contact 20, and a dielectric material 36 in the via 28. The via 28 (FIG. 1D) extends through the substrate contact 20, and through the full thickness of the semiconductor substrate 12, from the circuit side 16 to the back side 18 thereof. In the illustrative embodiment, the via 28 (FIG. 1D) is generally circular, and has an inside diameter (ID) which is about 1.5 to 3 times larger than the outside diameter (OD) of the wire 30 (FIG. 1D). By way of example, the wire 30 (FIG. 1D) can have an outside diameter (OD) of about 25 μm, and the via 28 (FIG. 1D) can have an inside diameter (ID) of about 37.5 μm to 75 μm. In addition, a length of the via 28 (FIG. 1D) is dependent on an overall thickness T of the semiconductor substrate 12 (FIG. 1D). A representative range for the thickness T of the semiconductor substrate 12 (FIG. 1D) can be from about 10 μm to 725 μm, depending on whether the semiconductor substrate 12 is a full thickness die or wafer, or a thinned die or wafer.

The via 28 (FIG. 1D) can also include an insulating layer 34 (FIG. 1D) formed on an inside diameter thereof, which electrically insulates the via 28 (FIG. 1D) from the integrated circuits 22 (FIG. 1D), and other electrical elements on the semiconductor substrate 12. The insulating layer 34 (FIG. 1D) can comprise an electrically insulating material, such as a polymer (e.g., polyimide or parylene) or an oxide (e.g., $SiO_2$). As will be further explained, the wire 30 (FIG. 1D), rather than the via 28 (FIG. 1D), or in addition to the via 28 (FIG. 1D), can be electrically insulated.

Figure 1C:
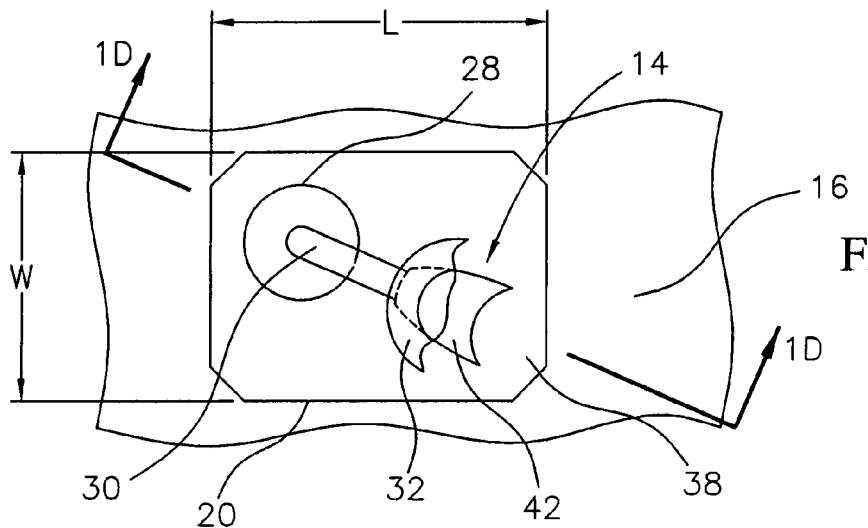
FIG. 1C is an enlarged schematic plan view taken along line 1C of FIG. 1A illustrating a through wire interconnect of the semiconductor component, with a bonding member cut away to show a ball bond.
Figure 1D:
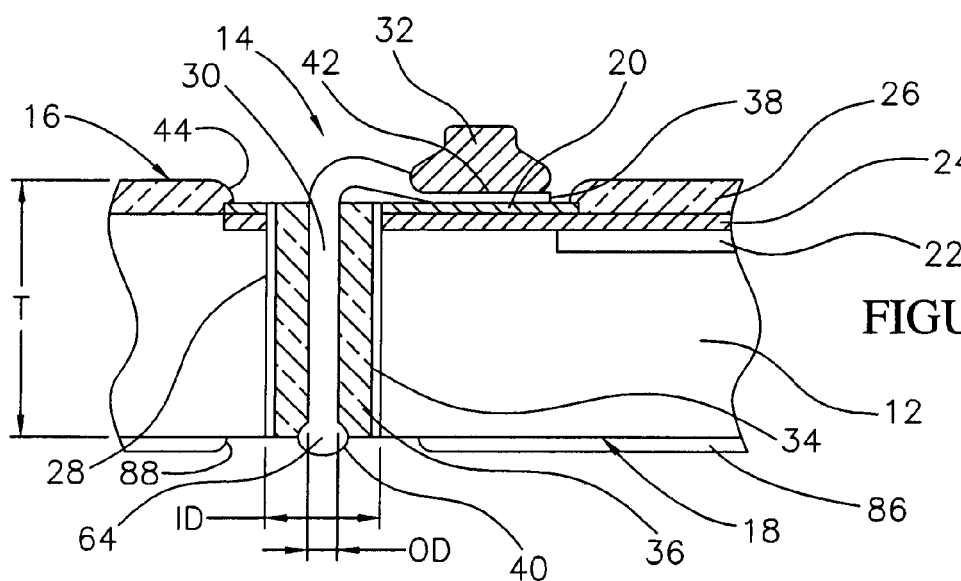
FIG. 1D is an enlarged schematic cross sectional view taken along section line 1D-1D of FIG. 1C illustrating a through wire interconnect.
Figure 3A:
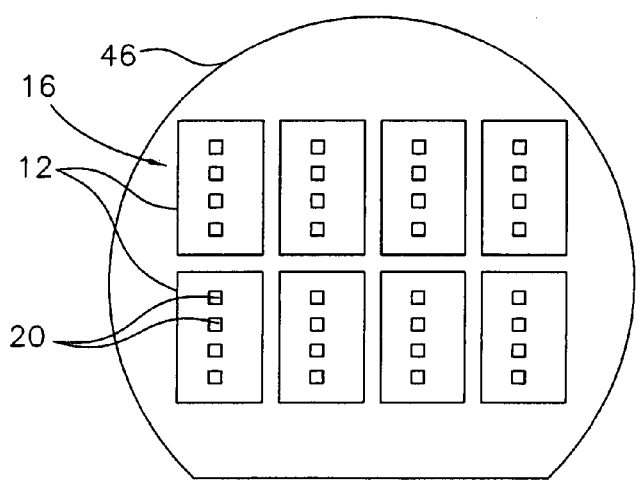
FIG. 3A is a schematic plan view taken along line 3A-3A of FIG. 2A illustrating multiple semiconductor substrates on a wafer for performing a wafer level fabrication method.

In FIG. 1C, the via 28 is illustrated as being located in an upper left hand corner of the substrate contact 20. In other words, the via 28 is offset in both x and y directions from a center of the substrate contact 20. In this case, the via 28 can have an inside diameter (ID) (FIG. 1D) that is about one half of the width (L) (FIG. 1C) of the substrate contact 20 (FIG. 1C). Alternately, as shown in FIG. 3C, a via 28A can be located in the center 48 (FIG. 3C) of the substrate contact 20. Further, multiple vias 28B (FIG. 3D), 28C (FIG. 3E) or 28D (FIG. 3F), can be formed in the same substrate contact 20.

As shown in FIG. 1D, the wire 30 is located along a longitudinal axis 70 (FIG. 2E) of the via 28, and extends across the entire length of the via 28. The wire 30 (FIG. 1D) can be held in place in the via 28 (FIG. 1D) by the dielectric material 36 (FIG. 1D), which fills the via 28 (FIG. 1D) and surrounds the wire 30 (FIG. 1D). In addition, the wire 30 (FIG. 1D) has a first end 38 (FIG. 1D) extending out of the via 28 (FIG. 1D) and bonded to the substrate contact 20 (FIG. 1D), and a second end 40 (FIG. 1D) extending just outside of the via 28 proximate to the back side 18 (FIG. 1D) of the semiconductor substrate 12.

The through wire interconnect 14 (FIG. 1D) also includes a bonded connection 42 (FIG. 1D) between the first end 38 (FIG. 1D) of the wire 30 and the substrate contact 20. In addition, the second end 40 (FIG. 1D) of the wire 30 can comprise a generally spherically shaped contact ball 64, such as a "free air ball" formed using an electronic flame off (EFO) process to be hereinafter described.

In the through wire interconnect 14 (FIG. 1D), the bonded connection 42 (FIG. 1D) comprises a ball bond formed using a wire bonding process, such as thermosonic wire bonding. Alternately, a through wire interconnect 14A (FIGS. 1E and 1F) can include a bonded connection 42A (FIGS. 1E and 1F) in the form of a wedge bond formed using ultrasonic wire bonding. As another alternative, a through wire interconnect 14B (FIGS. 1G and 1H) can include a ribbon wire 30B (FIGS. 1G and 1H) such as a bonding ribbon, and a bonded connection 42B (FIGS. 1G and 1H) can comprise a ribbon wire bond. As another alternative, a through wire interconnect 14C (FIGS. 1I and 1J) can include a compressed wire 30C (FIGS. 1I and 1J), and a bonded connection 42C (FIGS. 1I and 1J) can be in the form of a stud bump and a compression flange on the compressed wire 30C (FIGS. 1I and 1J).

A representative outside diameter (OD) (FIG. 1D) of the wire 30 can be from about 12 μm to about 150 μm. In addition, the wire 30 (FIG. 1D) can comprise a conventional wire material used in semiconductor packaging, such as solder alloys, gold, gold alloys, copper, copper alloys, silver, silver alloys, aluminum, aluminum-silicon alloys, and aluminum-magnesium alloys. In addition, the wire 30 (FIG. 1D) can comprise a metal, or a metal alloy, that does not contain reductions of hazardous substances (ROHS), such as lead. Exemplary ROHS free metals include lead free solders, such as 97.5% Sn2.5% Ag. Other ROHS free metals include gold, copper and alloys of these metals such as copper coated with a layer of flash gold. Also, the melting point of the wire 30 (FIG. 1D) should preferably be greater than that of the substrate contact 20.

As also shown in FIG. 1D, in the through wire interconnect 14, the bonding member 32 is located next to the via 28, and is bonded to the substrate contact 20 in a right, lower quadrant of the substrate contact 20. Alternately, the bonding member 32 (FIG. 1D) can be centered on the substrate contact 20 (FIG. 1D) and on the via 28 (FIG. 1D), or located on any portion of the substrate contact 20 (FIG. 1D) or the via 28 (FIG. 1D). The bonding member 32 (FIG. 1D) bonds portions of the wire 30 (FIG. 1D) to the substrate contact 20 (FIG. 1D). In addition, the bonding member 32 (FIG. 1D) functions as a securing and supporting structure for the wire 30 (FIG. 1D), and as a bonding structure for bonding the through wire interconnect 14 (FIG. 1D) to an external electrical element, such as contacts on a support substrate, or another through wire interconnect on another semiconductor component. The bonding member 32 (FIG. 1D) preferably comprises a non oxidizing, bondable material such as gold or platinum, or a reflow material, such as solder.

In the illustrative embodiment, the bonding member 32 (FIG. 1D) comprises a stud bump, or a ball bump, bonded to the substrate contact 20. In this case, the bonding member 32 (FIG. 1D) can be formed using a wire bonder, a stud bumper, or a ball bumper. Alternately, the bonding member 32 (FIG. 1D) can comprise a solder joint, a welded connection, or a conductive polymer connection, formed using a bonding process, such as thermal or pressure bonding to the substrate contact 20. In FIG. 1D, the bonding member 32 has a diameter which is less than the length (L) and the width (W) of the substrate contact 20 (e.g., 25% to 75%), such that it covers only a portion of the substrate contact 20, and does not cover the via 28. However, as shown in FIGS. 1E and 1F, a bonding member 32A can also be configured to substantially cover the substrate contact 20 and the via 28.

Figure 1E:
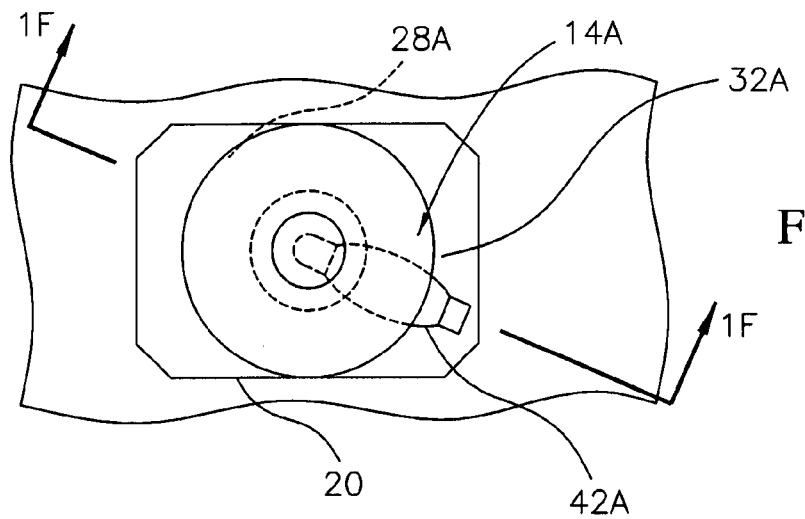
FIG. 1E is an enlarged schematic plan view equivalent to FIG. 1C, illustrating an alternate embodiment wedge bonded through wire interconnect on the semiconductor component.
Figure 1F:
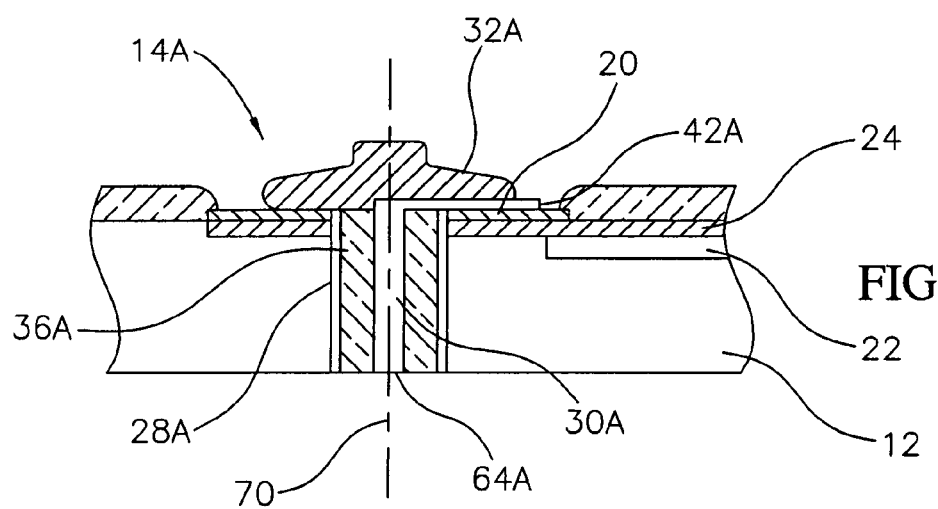
FIG. 1F is an enlarged schematic cross sectional view taken along section line 1F-1F of FIG. 1E illustrating the wedge bonded through wire interconnect.

Referring to FIGS. 1E and 1F, an alternate embodiment wedge bonded through wire interconnect 14A is substantially similar to the through wire interconnect 14 (FIG. 1D), but includes a wire 30A (FIG. 1F) that is wedge bonded to the substrate contact 20. In this embodiment, a bonded connection 42A (FIG. 1F) between the wire 30A (FIG. 1F) and the substrate contact 20 comprises a wedge bond formed using an ultrasonic bonding process. In addition, the through wire interconnect 14A (FIG. 1F) includes a bonding member 32A, which is substantially similar to the bonding member 32 (FIG. 1D). However, the bonding member 32A (FIG. 1E) covers almost all of the surface of the substrate contact 20 (FIG. 1E). In addition, the bonding member 32A (FIG. 1F) covers a via 28A (FIG. 1F), and substantially all of the bonded connection 42A (FIG. 1F). The through wire interconnect 14A also includes a dielectric material 36A (FIG. 1F) in the via 28A which secures and electrically insulates the wire 30A (FIG. 1F). In addition, the through wire interconnect 14A also includes a contact 64A which comprises an exposed planar surface on an end of the wire 30A.

Figure 1G:
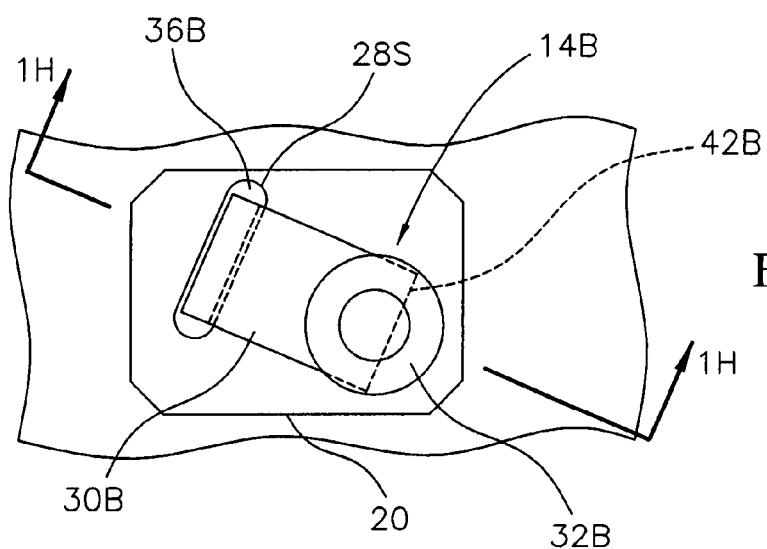
FIG. 1G is an enlarged schematic plan view equivalent to FIG. 1C, illustrating an alternate embodiment ribbon wire through wire interconnect on the semiconductor component.
Figure 1H:
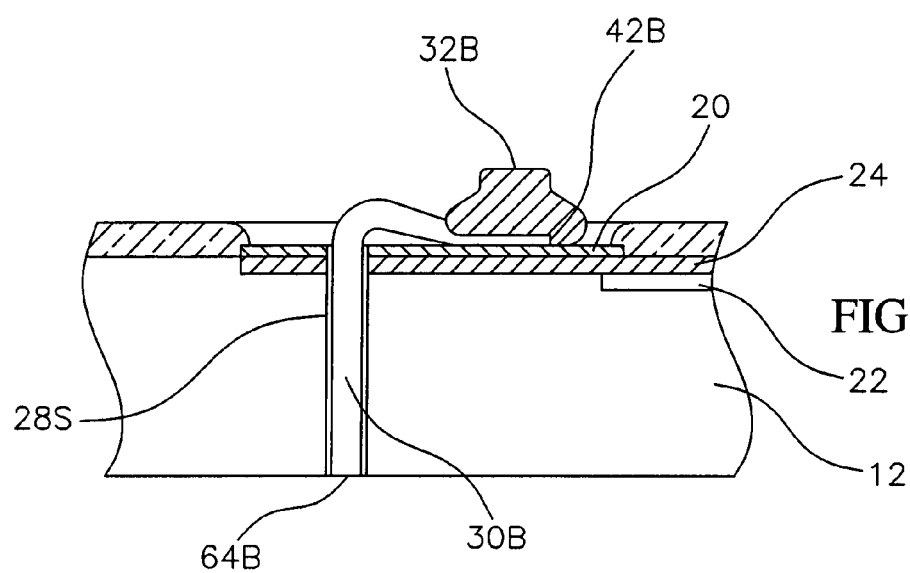
FIG. 1H is an enlarged schematic cross sectional view taken along section line 1H-1H of FIG. 1G illustrating the ribbon wire through wire interconnect.
Figure 1I:
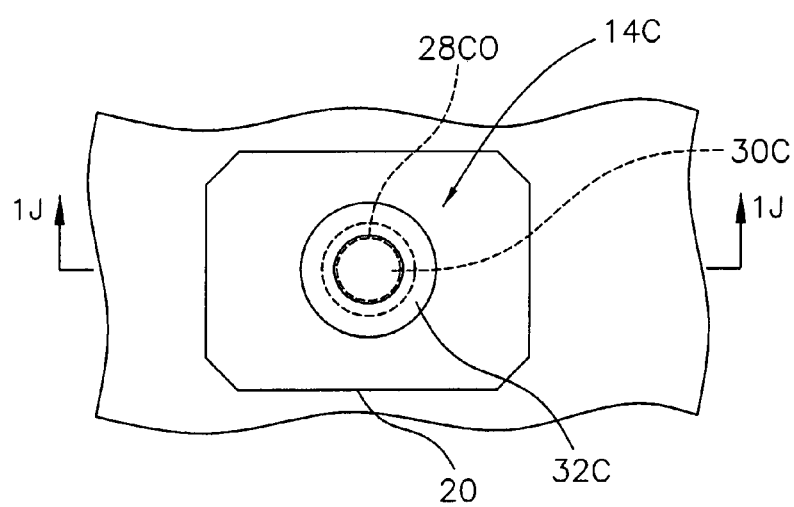
FIG. 1I is an enlarged schematic plan view equivalent to FIG. 1C, illustrating an alternate embodiment compressed through wire interconnect on the semiconductor component.
Figure 1J:
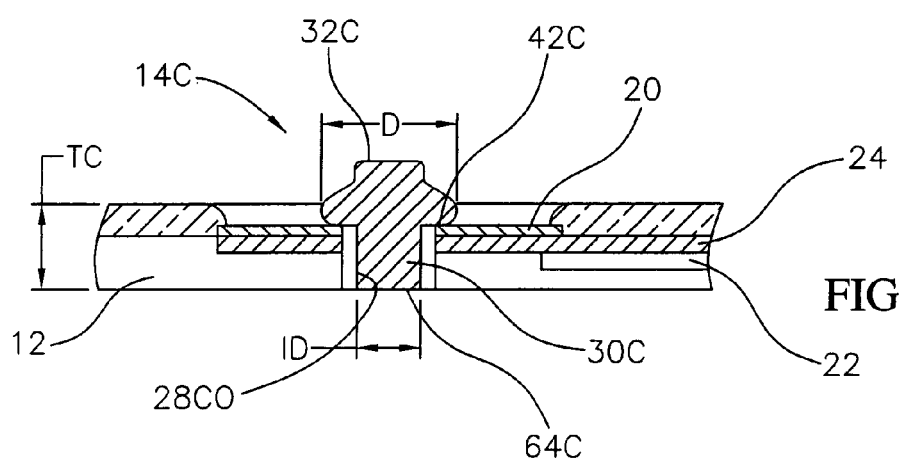
FIG. 1J is an enlarged schematic cross sectional view taken along section line 1J-1J of FIG. 1I illustrating the compressed through wire interconnect.

Referring to FIGS. 1G and 1H, an alternate embodiment ribbon wire through wire interconnect 14B is substantially similar to the through wire interconnect 14 (FIG. 1D), but includes a ribbon wire 30B (FIG. 1G) in the form of a bonding ribbon. Further, a bonded connection 42B (FIG. 1H) between the ribbon wire 30B (FIG. 1G) and the substrate contact 20 comprises a wedge bond formed using a ribbon wire bonding process. In addition, the through wire interconnect 14B (FIG. 1G) includes a bonding member 32B (FIG. 1H), which is substantially similar to the bonding member 32 (FIG. 1D). Further, the through wire interconnect 14B (FIG. 1G) includes a slot via 28S (FIG. 1FG), configured to accommodate the ribbon wire 30B (FIG. 1G). The through wire interconnect 14B (FIG. 1G) also includes a dielectric material 36B (FIG. 1H) in the slot via 28A (FIG. 1G), which secures and electrically insulates the ribbon wire 30B (FIG. 1G). In addition, the through wire interconnect 14B also includes a contact 64B which comprises an exposed surface of the ribbon wire 30B.

Depending on the application, the ribbon wire 30B (FIG. 1G) can have a selected size from fine ribbon wire [13 μm×51 μm (0.5×2 mil)] to heavy ribbon wire [25.4 μm×254 mm (1×10 mil)]. In addition, the ribbon wire 30B (FIG. 1G) can comprise a conventional material such as gold, aluminum, silver or palladium. In general, the ribbon wire 30B (FIG. 1G) provides several advantages over round wire including high reliability bonded connections 42B (FIG. 1G), a high pull strength due to more surface contact, less cratering, minimal wire sway, longer wire spans, and a planar bonding surface for the bonding member 32B (FIG. 1H). In addition, the ribbon wire 30B (FIG. 1G) provides a low impedance and a low inductance due to the skin effect at high frequency (i.e., current density concentration in the surface layers of the conductors increases with frequency). Due to the skin effect, the surface area of the ribbon wire 30B (FIG. 1G) provides a larger surface area for current carrying relative to round wire. Automatic ribbon bonders are available from Kulicke & Soffa Industries, Inc. of Willow Grove, Pa.

Referring to FIGS. 1I and 1J, an alternate embodiment compressed wire through wire interconnect 14C is substantially similar to the through wire interconnect 14 (FIG. 1D), but includes a compressed wire 30C (FIG. 1J) such as a stud bump, wedged into a via 28CO. In this embodiment, the substrate 12 has a thickness TC that is ultra thin (e.g., 10-100 μm). In addition, a depth of the via 28CO can be only slightly greater than an initial diameter of the compressed wire 30C. Also in this embodiment, a bonding member 32C (FIG. 1J) is formed integrally with the compressed wire 30C (FIG. 1J), and a bonded connection 42C (FIG. 1J) comprises a flanged portion of the bonding member 32C (FIG. 1J) bonded to the substrate contact 20. A diameter d of the bonding member 32C (FIG. 1J) is slightly greater than the inside diameter ID (FIG. 1J) of the via 28CO. The compressed wire through wire interconnect 14C (FIG. 1J) also includes a contact 64C which comprises an exposed surface of the compressed wire 30C.

Figure 1K:
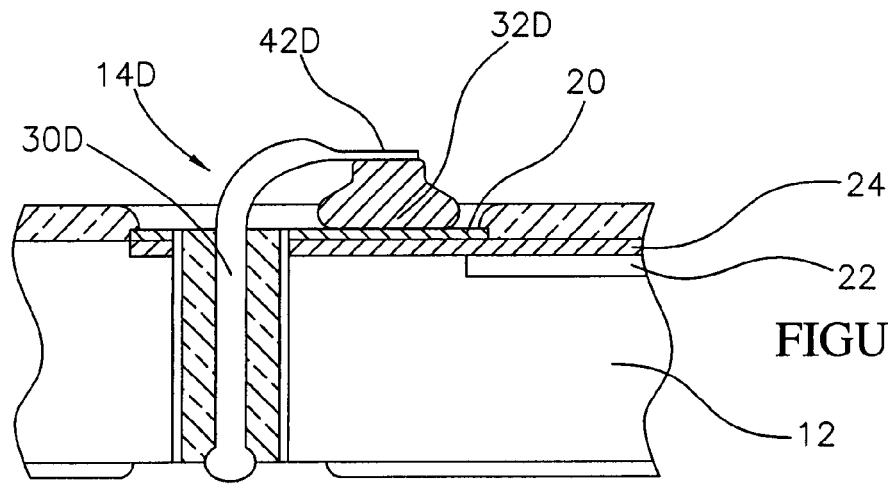
FIG. 1K is an enlarged schematic plan view equivalent to FIG. 1D, illustrating an alternate embodiment wire-on-bonding-member through wire interconnect on the semiconductor component.

Referring to FIG. 1K, an alternate embodiment wire-on-bonding-member through wire interconnect 14D is substantially similar to the through wire interconnect 14 (FIG. 1D), but includes a wire 30D bonded to a top portion of a bonding member 32D. In this embodiment, a bonded connection 42D is formed between the wire 30D and a top portion of the bonding member 32D. For example, the bonding member 32D could comprise a stud bump bonded to the substrate contact 20, and the bonded connection 42D could comprise a ball bond formed on the stud bump. Alternately, the bonded connection 42D can be formed anywhere on the bonding member 32D such as in the center, or on an exterior surface thereof.

Figure 1L:
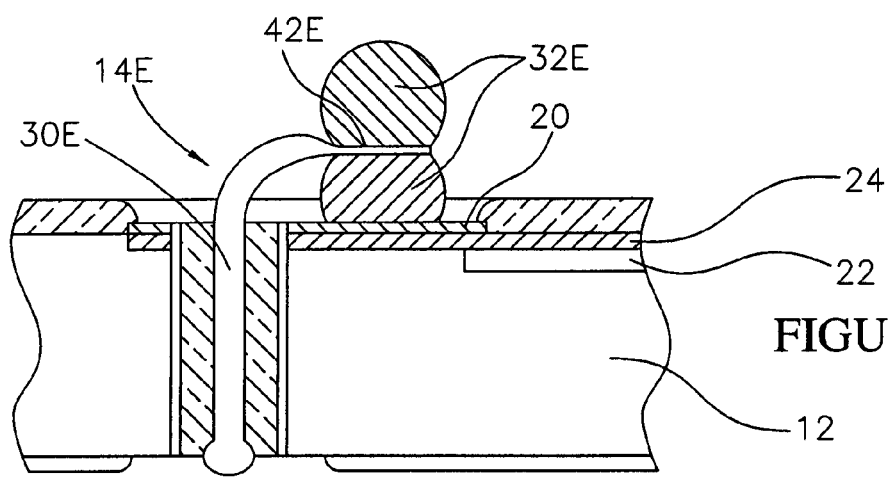
FIG. 1L is an enlarged schematic plan view equivalent to FIG. 1D, illustrating an alternate embodiment double-bump through wire interconnect on the semiconductor component.

Referring to FIG. 1L, an alternate embodiment double-bump through wire interconnect 14E is substantially similar to the through wire interconnect 14 (FIG. 1D), but includes a double bump 32E. In this embodiment, a bonded connection 42E comprises a wire 30E within the double bump 32E sandwiched between the stacked bumps of the double bump 32E. Alternately, the bonded connection 42E can be formed between the lowermost bump of the double bump 32E and the substrate contact 20. U.S. Pat. Nos. 5,496,775 and 6,717,245, both of which are incorporated herein by reference, disclose double bump structures and techniques.

Figure 1M:
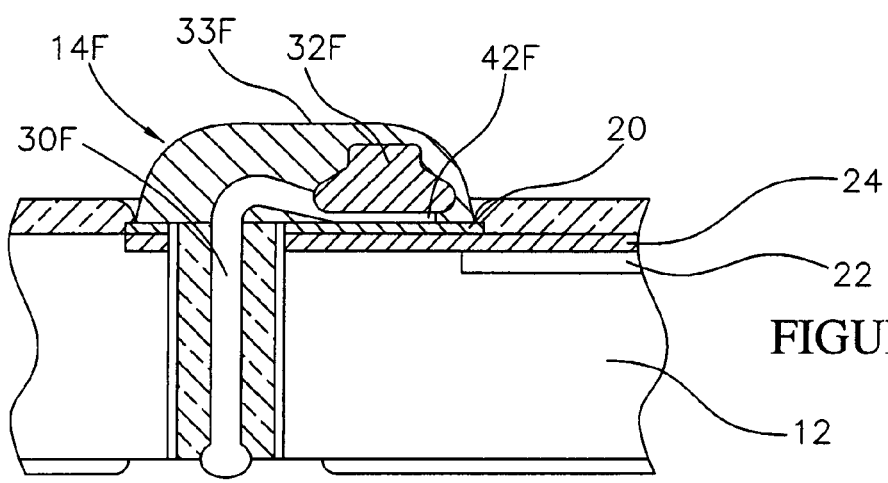
FIG. 1M is an enlarged schematic plan view equivalent to FIG. 1D, illustrating an alternate embodiment cap-member through wire interconnect on the semiconductor component.

Referring to FIG. 1M, an alternate embodiment cap-member through wire interconnect 14F is substantially similar to the through wire interconnect 14 (FIG. 1D), but includes a cap member 33F that encapsulates a bonding member 32F and a bonded connection 42F between a wire 30F and the substrate contact 20. The cap member 33F can comprise an electrically conductive material such as solder or a conductive polymer. In this embodiment, the cap member 33F can be used as an electrically conductive bonding structure for fabricating stacked components.

Figure 2A:
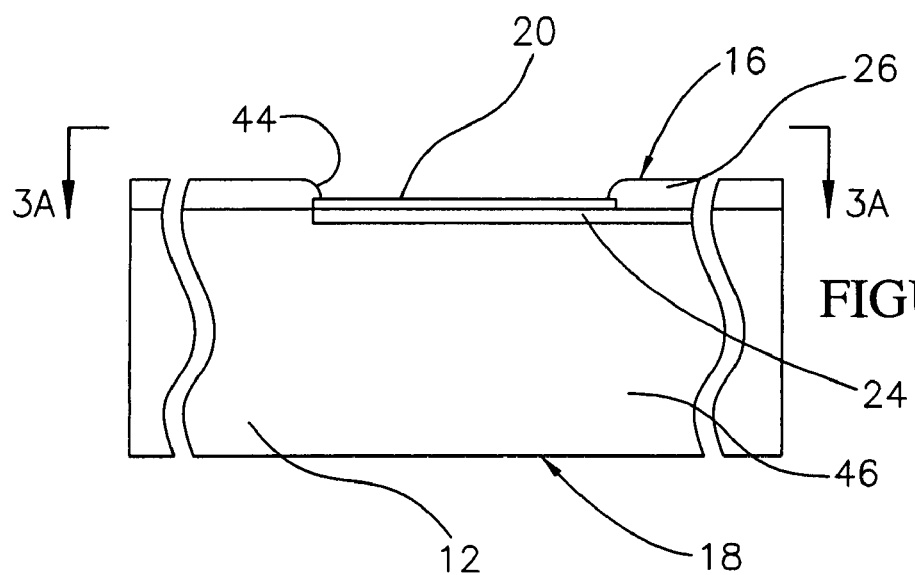
FIGS. 2A-2P are schematic cross sectional views illustrating steps in a method for fabricating a semiconductor component with a through wire interconnect.
Figure 2B:
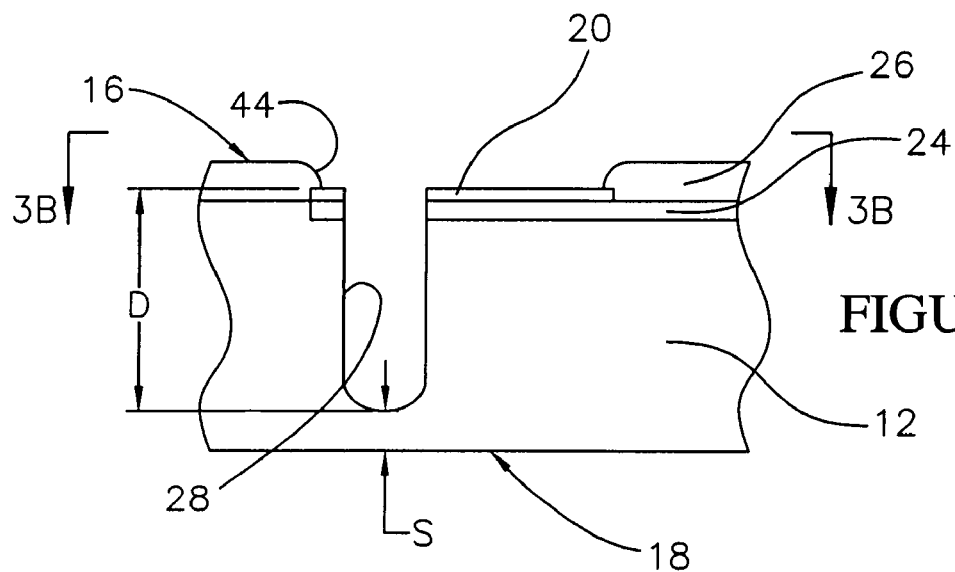
FIGS. 2Q-2T are schematic cross sectional views illustrating steps in a method for fabricating a semiconductor component with a compressed wire through wire interconnect.
Figure 2C:
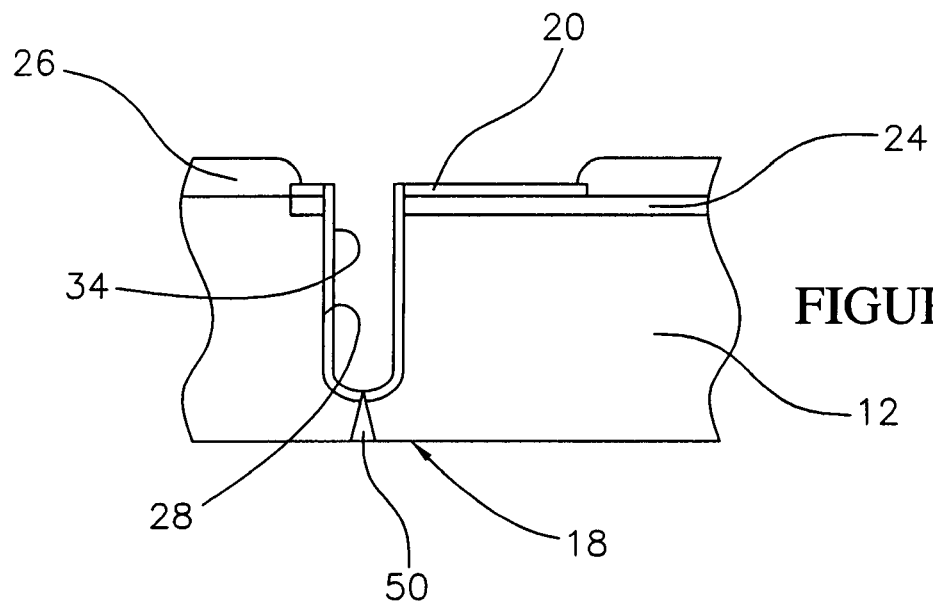
Figure 2D:
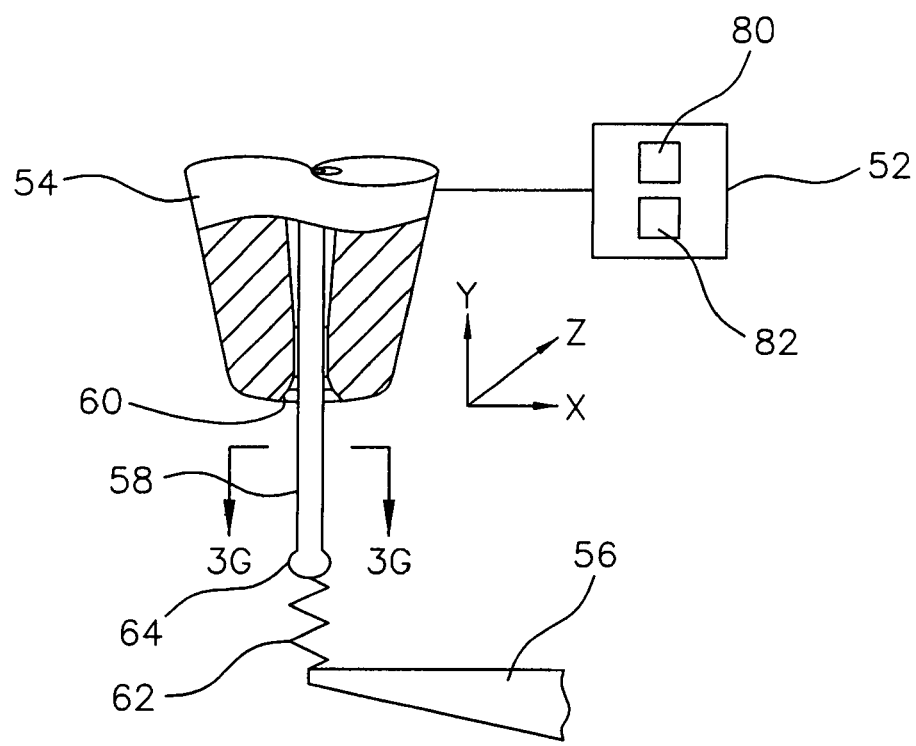
Figure 2E:
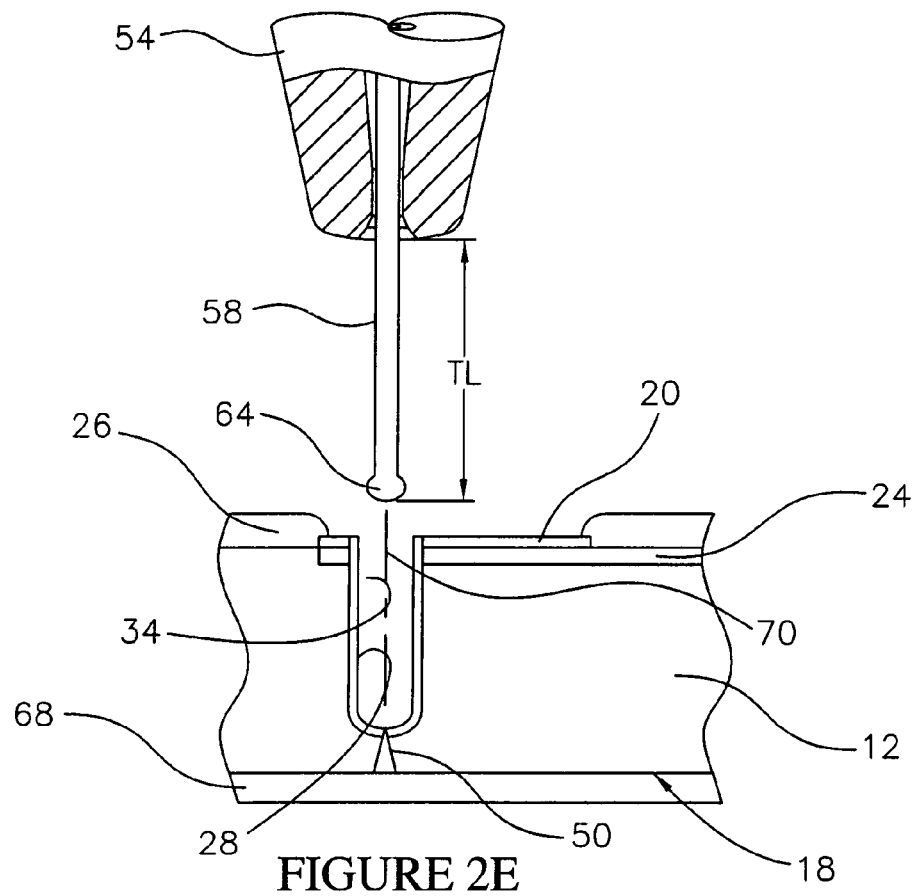
Figure 2F:
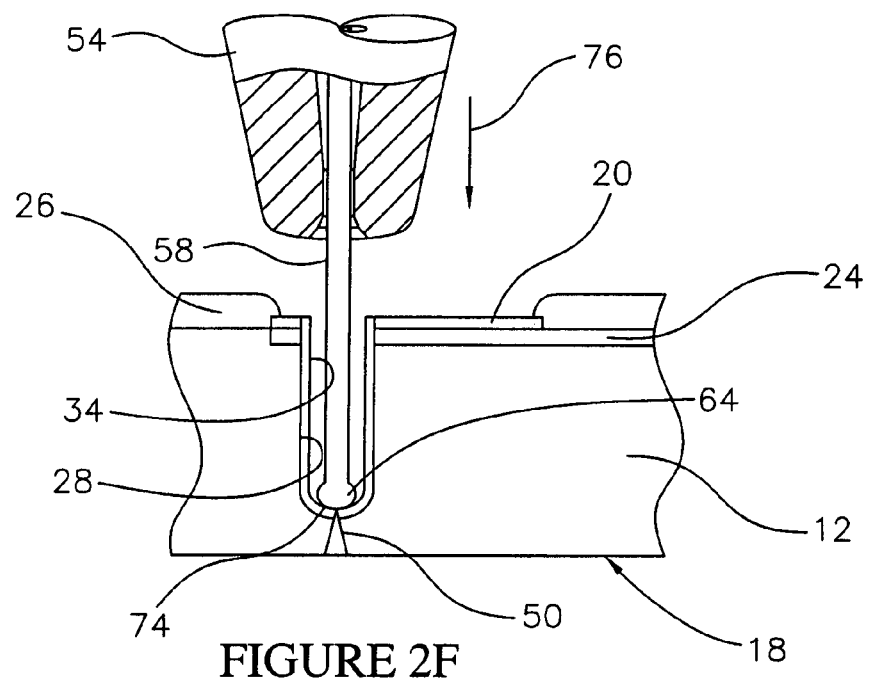
Figure 2G:
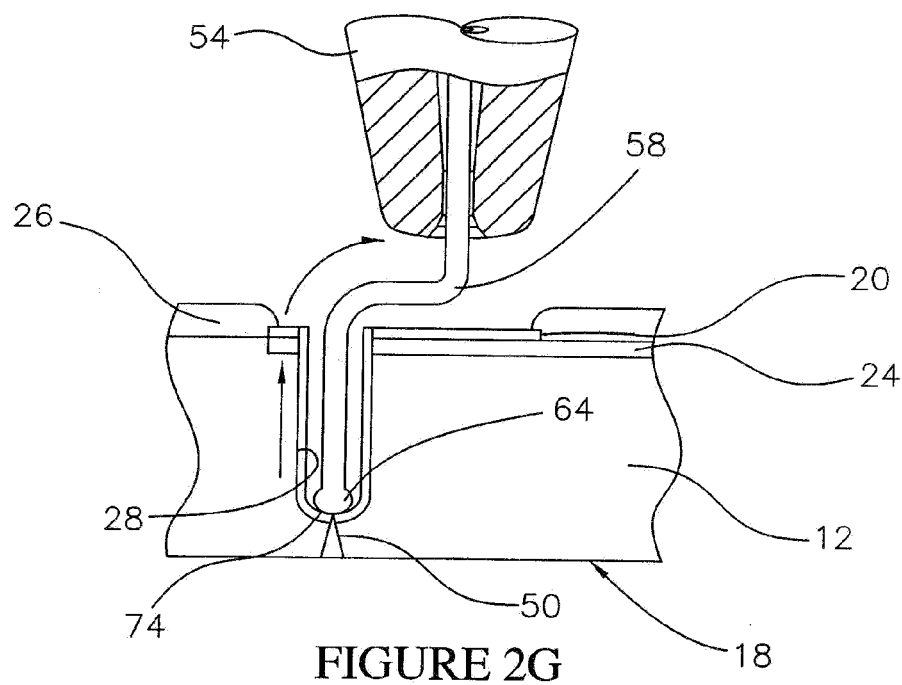
Figure 2H:
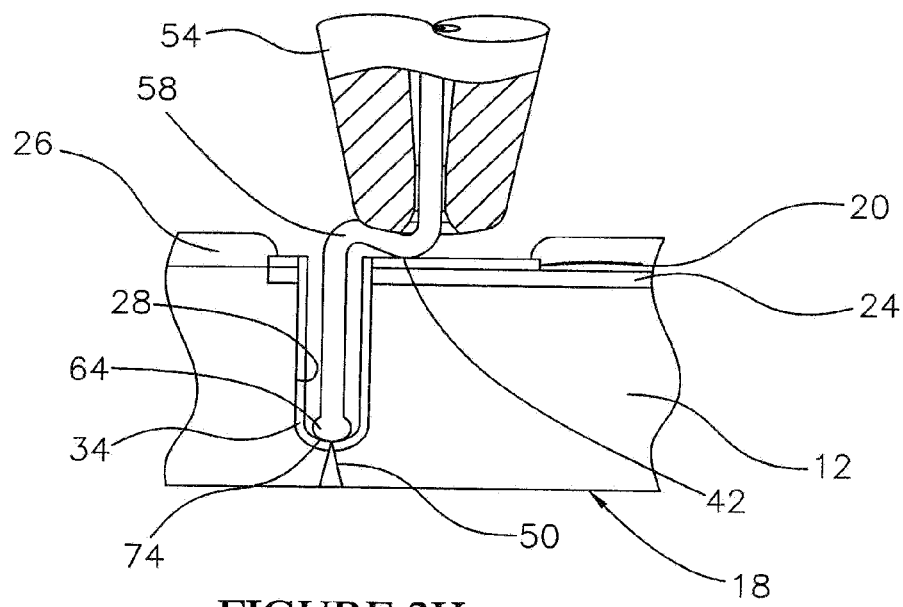
Figure 2I:
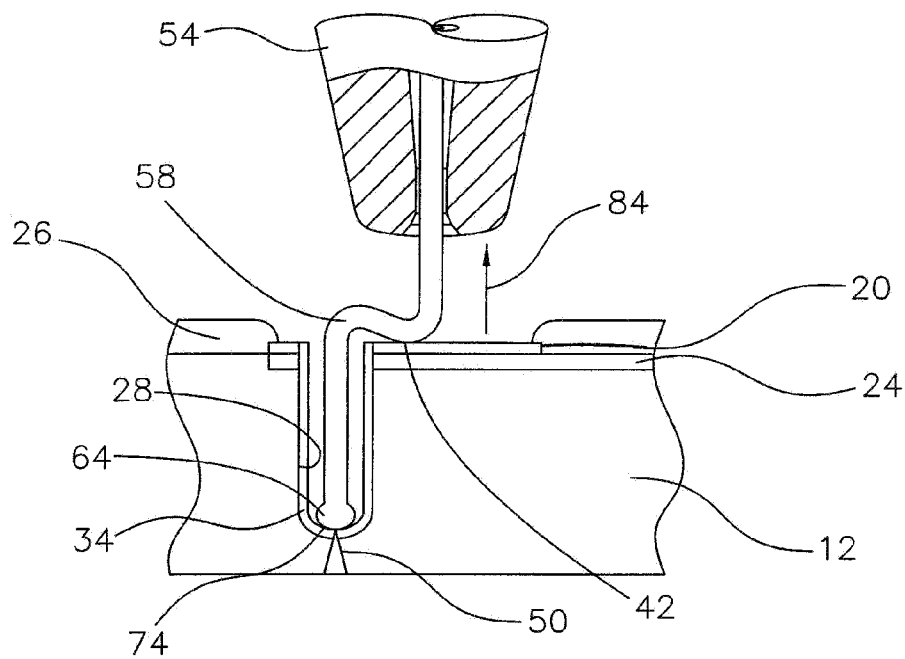
Figure 2J:
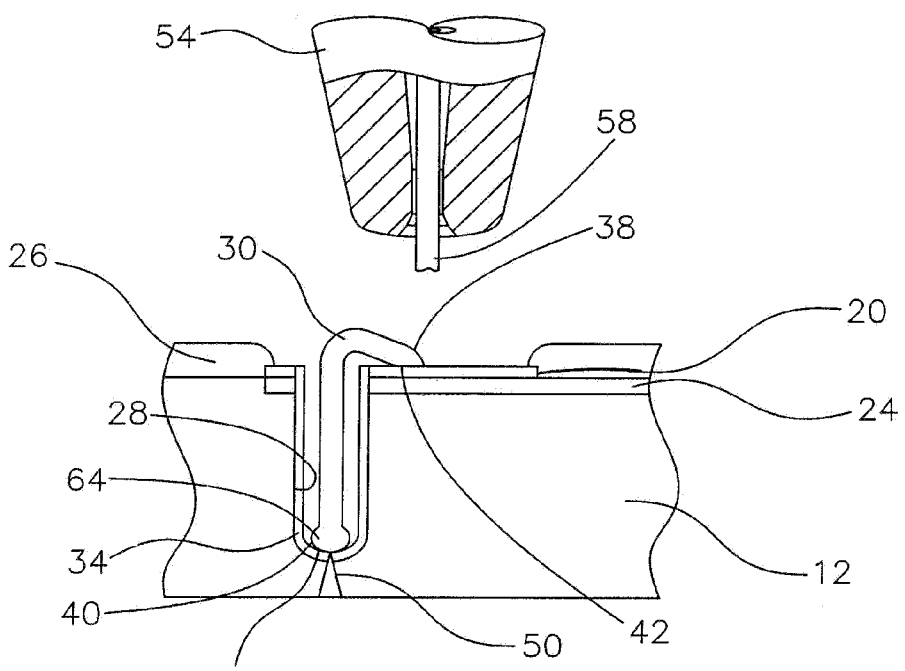
Figure 2K:
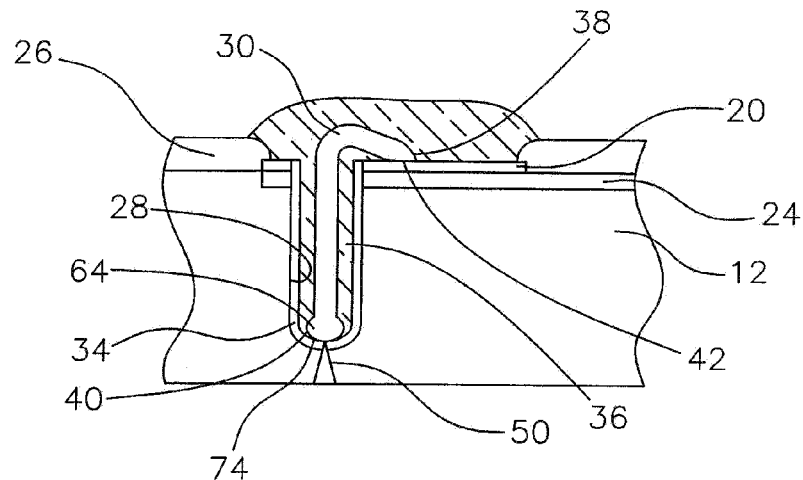
Figure 2L:
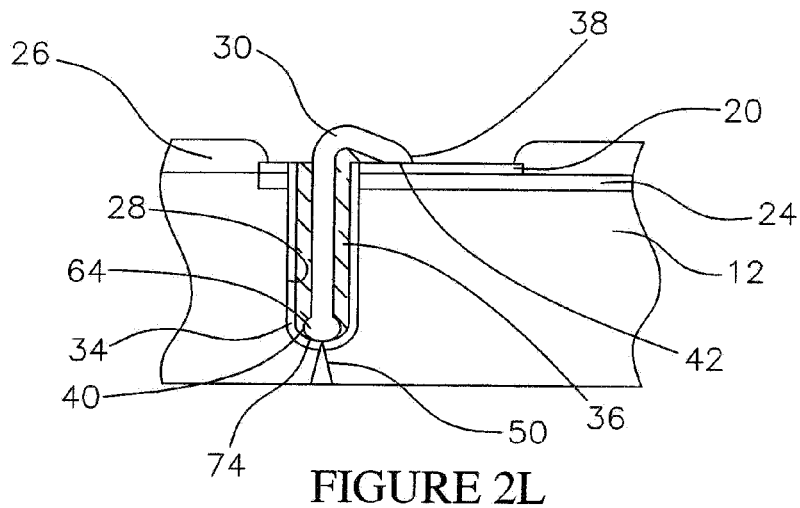
Figure 2M:
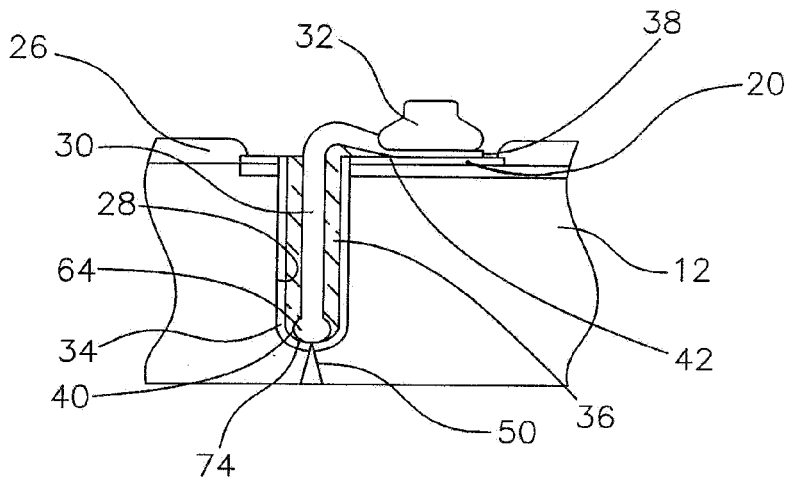
Figure 2N:
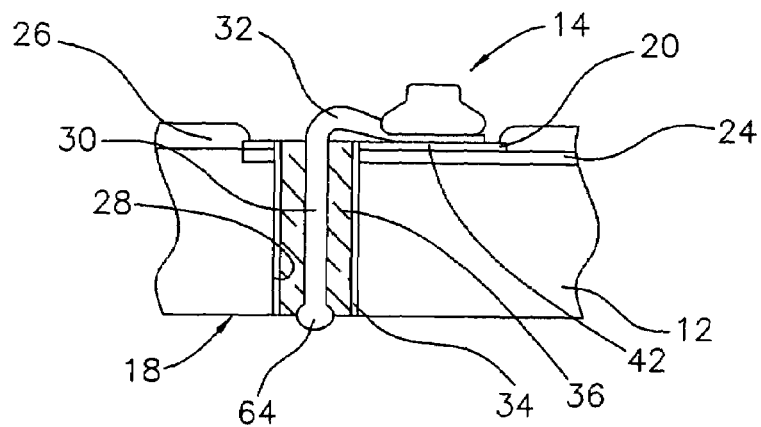
Figure 2O:
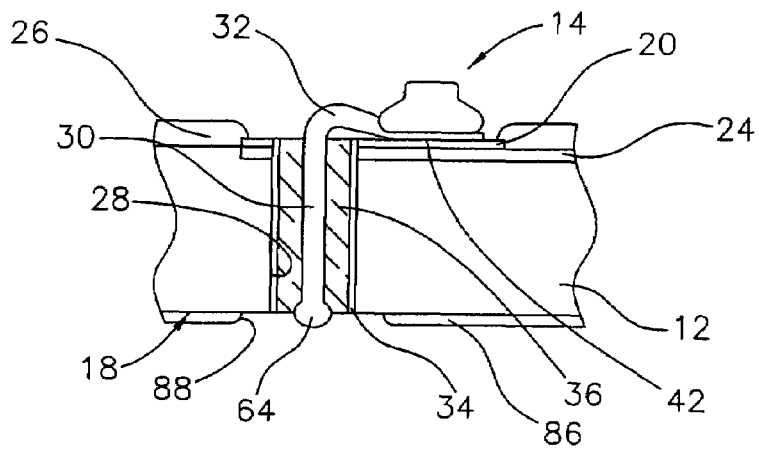
Figure 2P:
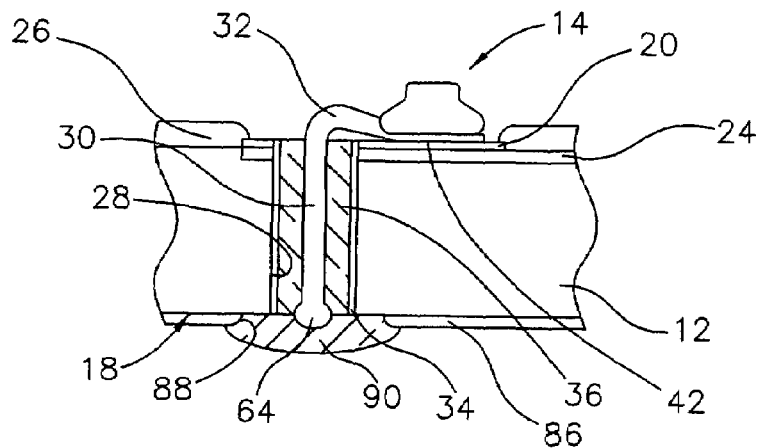

Referring to FIGS. 2A-2P, steps in a method for fabricating the component 10 (FIG. 1A) with through wire interconnects 14 (FIG. 1A) is illustrated. Initially, as shown in FIG. 2A, the semiconductor substrate 12 is provided substantially as previously described, with the substrate contact 20, the passivation layer 26 and the internal conductor 24 in electrical communication with the integrated circuits 22 (FIG. 1D). Alternately, rather than being electrically connected to the integrated circuits 22 (FIG. 1D), for stacking applications, the substrate contact 20 can be electrically isolated. This concept will be further explained as the description proceeds.

In the illustrative embodiment, the method is performed at the wafer level on a semiconductor wafer 46 (FIG. 3A) containing a plurality of semiconductor substrates 12. However, it is to be understood that the method of the invention can be performed at the die level on singulated substrates, such as singulated bare dice and known good dice (KGD). Also in the illustrative embodiment, the semiconductor wafer 46 (FIG. 3A) comprises a semiconductor material, such as silicon or gallium arsenide. In addition, the semiconductor substrates 12 (FIG. 3A) are in the form of semiconductor dice having a desired electrical configuration, such as memory, application specific, or imaging and image sensing. However, it is to be understood that the method of the invention can be performed on other substrates including ceramic, plastic, tape, printed circuit board (PCB), metal lead frame, or flex circuit substrates. As shown in FIG. 2A, the semiconductor substrate 12 includes the circuit side 16 with the substrate contacts 20 and die passivation layer 26 thereon, and the back side 18.

Next, as shown in FIG. 2B, the vias 28 are formed through the substrate contacts 20, but only part way through the substrate 12. The vias 28 can be formed using an etching process, a laser machining process, an ion milling process, a mechanical process (e.g., drilling, grinding, abrasion), or combinations of any of these processes. For example, the vias 28 can be formed using a dry etch process, such as a reactive ion etching (RIE) through a mask, such as a photo mask or a hard mask, having openings, which locate the vias 28 on the substrate contacts 20. In this case, a first etch gas can be used to etch through the substrate contacts 20, and a second etch gas can be used to etch part way through the semiconductor substrate 12. In addition, parameters (e.g., time, temperature, etchant) of the dry etch process can be controlled such that a depth "D" of the vias 28 (FIG. 2B) is endpointed within the semiconductor substrate 12 at a distance "S" (FIG. 2B) from the back side 18. With the wafer 46 and the semiconductor substrate 12 comprising silicon, reactive ion etching (RIE) can be performed in a reactor with an etch gas, such as $CF_4$, $SF_6$, $Cl_2$ or $CCl_2F_2$. Reactive ion etching (RIE) is sometimes referred to as "BOSCH" etching, after the German company Robert Bosch, which developed the original process.

Another method for forming the vias 28 (FIG. 2B) combines etching and laser machining processes. For example, an etch mask (not shown) and an etching process can be used to form the vias 28 through the substrate contacts 20. Depending on the material of the substrate contacts 20, a wet etchant can be used. For substrate contacts 20 made of aluminum, one suitable wet etchant is $H_3PO_4$. Following etching through the substrate contacts 20, a laser machining process can be used to form the vias 28 part way through the semiconductor substrate 12. One suitable laser system for performing the laser machining step is manufactured by XSIL LTD of Dublin, Ireland, and is designated a Model No. XISE 200. Another suitable laser system for performing the laser machining step is manufactured by Electro Scientific, Inc., of Portland, Oreg. and is designated a Model No. 2700. Following the laser machining step, a cleaning step can be performed in which the vias 28 (FIG. 2B) are cleaned using a suitable wet or dry etchant. One suitable wet etchant with the semiconductor substrate 12 (FIG. 2B) comprising silicon comprises tetramethylammoniumhydroxide (TMAH). U.S. Pat. No. 6,620,731, to Farnworth et al. which is incorporated herein by reference, further describes methods for forming the vias 28 (FIG. 2B).

Figure 3B:
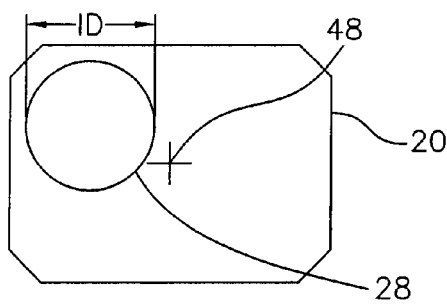
FIG. 3B is an enlarged schematic plan view taken along line 3B-3B of FIG. 28 illustrating an offset via configuration on a substrate contact.
Figure 3C:
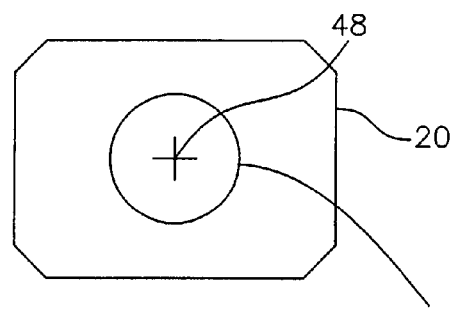
FIGS. 3C-3F are enlarged schematic plan views equivalent to FIG. 3B, illustrating alternate via configurations, including multiple vias, on substrate contacts.
Figure 3D:
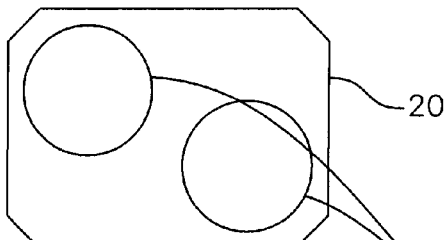
Figure 3E:
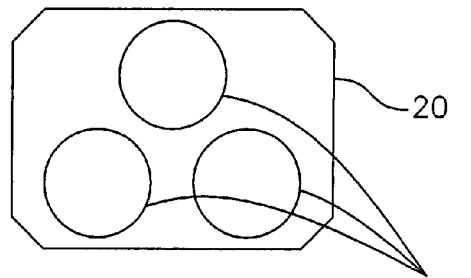
Figure 3F:
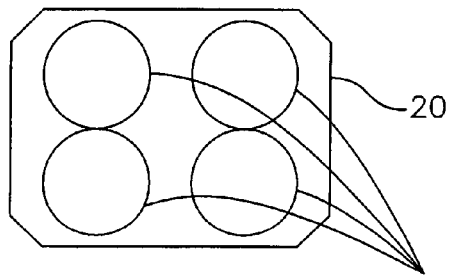

As shown in FIG. 3B, in the illustrative embodiment the vias 28 are offset in x and y directions from the centers 48 of the substrate contacts 20. This arrangement provides the most surface area on the substrate contacts 20 available for subsequently forming the bonded connections 42 (FIG. 1C). As shown in FIG. 3C, the vias 28A can alternately be formed through the centers 48 of the substrate contacts 20. In this case, the bonded connections 42A (FIG. 1F) can be radially offset from the centers 48 of the substrate contacts 20. As shown in FIG. 3D, two vias 28B can also be formed on each substrate contact 20 for forming two through wire interconnects on each substrate contact 20. As shown in FIG. 3E, three vias 28C can also be formed on each substrate contact 20 for forming three through wire interconnects on each substrate contact 20. As shown in FIG. 3F, four vias 28D can also be formed on each substrate contact 20 for forming four through wire interconnects on each substrate contact 20.

Next, as shown in FIG. 2C, the insulating layers 34 can be formed in the vias 28. The insulating layers 34 can comprise a polymer, such as polyimide or parylene, deposited using a suitable process, such as vapor deposition, capillary injection or screen-printing. Alternately, the insulating layers 34 can comprise a deposited oxide layer, such as a low temperature deposited oxide. As another alternative, the insulating layers 34 can comprise a grown oxide layer, such as silicon dioxide formed by oxidation of silicon.

As also shown in FIG. 2C, a vent 50 can be formed from the back side 18 of the semiconductor substrate 12 into each via 28. The vents 50 (FIG. 2C) can be formed using a laser machining process, and the previously described laser systems. Alternately, the vents 50 (FIG. 2C) can be formed using an etching process performed from the back side 18 of the semiconductor substrate 12. As will be further explained, the vents 50 (FIG. 2C) allow the wire 30 (FIG. 1D) and the dielectric material 36 (FIG. 1D) to be more easily placed in the via 28 (FIG. 2C). For example, the vents 50 provide a pressure differential for venting trapped gases from the via 28 during placement of the wire 30 (FIG. 1D) and during deposition of the dielectric material 36 (FIG. 1D). In addition, the vents 50 help to draw and seat the wires 30 (FIG. 1D) in vias 28. The vents 50 (FIG. 1D) also provide capillary action under a vacuum for depositing the dielectric material 36 into the vias 28. Preferably, the vents 50 (FIG. 2C) have a diameter that is less than the diameter of the wires 30 (FIG. 1D). In addition, the diameter of the vents 50 (FIG. 2C) can be selected to provide seats for the second ends 40 of the wires 30. A representative diameter of the vents 50 (FIG. 2C) can be from 5 µm to 15 µm. In FIG. 2C, the vents 50 are tapered from the back side 18 of the semiconductor substrate 12, as would occur with a laser machining process, wherein lasered openings are larger at the point of entry.

Next, as shown in FIG. 2D, a wire bonder 52 having a bonding capillary 54 can be provided. Preferably the wire bonder 52 is configured to perform an ultra fine pitch (e.g., <65 µm) wire bonding process. Suitable wire bonders are manufactured by Kulicke & Soffa Industries Inc. of Willow Grove, Pa., and Palomar of Carlsbad, Calif. One suitable wire bonder is a model "8098" large area ball bonder manufactured by Kulicke & Soffa Industries Inc., having a total bond placement accuracy of about +/−5 µm at pitches down to about 65 µm. Bonding capillaries are available from SPT (Small Precision Tools) of Petaluma, Calif., and from Kulicke & Soffa Industries Inc.

The wire bonder 52 (FIG. 2D) and the bonding capillary 54 are configured to form a continuous length of bonding wire 58 into the wire 30 (FIG. 1D) for the through wire interconnect 14 (FIG. 1D). The bonding wire 58 can comprise a conventional wire material used in semiconductor packaging, such as the previously identified materials for the wire 30 (FIG. 1D). As shown in FIG. 3G, the bonding wire 58 can be generally circular in cross section with an outside diameter (OD) selected to allow placement of the wire 58 into the via 28. A representative range for the outside diameter (OD) of the bonding wire 58 can be from about 12 µm to about 150 µm. As shown in FIG. 3H, an alternate embodiment insulated bonding wire 58A includes an electrically insulating outer layer 78, such as a polymer. The insulating layer 78 on the bonding wire 58 can take the place of the insulating layers 34 (FIG. 1D) in the vias 28 (FIG. 1D). This type of bonding wire 58A is available from Micro Bond of Canada.

As shown FIG. 3I, the insulated bonding wire 58A can be used to form a co-axial through wire interconnect 14CA-1. The co-axial through wire interconnect 14CA-1 (FIG. 3I) includes a via 28CA (FIG. 3I) through the substrate contact 20 and an insulating layer 34CA (FIG. 3I) on the via 28CA (FIG. 3I) substantially as previously described for the via 28 (FIG. 1D) and the insulating layer 34 (FIG. 1D). The co-axial through wire interconnect 14CA-1 also includes a dielectric material 36CA, which secures the insulated bonding wire 58A (FIG. 3I) in the via 28CA (FIG. 3I) substantially as previously described for dielectric material 36 (FIG. 1D). The co-axial through wire interconnect 14CA-1 also includes a co-axial conductor 31CA (FIG. 3I), which comprises an additional metal layer on the insulating layer 34CA (FIG. 3I). The co-axial conductor 31CA (FIG. 3I) forms a shield which confines radiation formed by a transverse electromagnetic (TEM) wave during transmission of electromagnetic signals through the wire 58A (FIG. 3I). The co-axial through wire interconnect 14CA-1 (FIG. 3I) can also be used to transmit first signals through the wire 58A (FIG. 3I), and to transmit second signals through the co-axial conductor 31CA (FIG. 3I).

As shown in FIG. 3J, an alternate embodiment co-axial through wire interconnect 14CA-2 is substantially similar to the co-axial through wire interconnect 14CA-1 (FIG. 3I), but includes the wire 30 (un-insulated as previously described), and an additional insulating layer 35CA on the co-axial conductor 31CA (FIG. 3J). Again, the co-axial conductor 31CA (FIG. 3J) forms a shield which confines radiation formed by a transverse electromagnetic (TEM) wave during transmission of electromagnetic signals through the wire 30 (FIG. 3I).

The co-axial through wire interconnect 14CA-2 (FIG. 3J) also allows first signals to be transmitted through the wire 30 (FIG. 3J), and second signals to be transmitted through the co-axial conductor 31CA (FIG. 3I).

Referring to FIG. 2D, the bonding capillary 54 is movable in x, y and z directions responsive to signals from a controller 80 of the wire bonder 52. The bonding capillary 54 includes an elongated opening 60 having an inside diameter about twice the diameter of the bonding wire 58, and an enlarged, chamfered terminal portion. The wire bonder 52 also includes wire clamps (not shown) operably associated with the bonding capillary 54, which are configured to open and close about the bonding wire 58 responsive to signals from the controller 80. U.S. patent application Ser. No. 11/102,408, filed on Apr. 8, 2005, which is incorporated herein by reference, provides further details of the wire bonder 52 and the bonding process to be hereinafter described.

As shown in FIG. 2D, the wire bonder 52 also includes an electronic flame off (EFO) wand 56 configured to generate an electronic spark 62 for forming the contact ball 64 on a terminal portion of the bonding wire 58. The contact ball 64 will subsequently form the first end 38 (FIG. 1D) of the wire 30. The contact ball 64 is also known in the art as a "free air ball" (FAB). A diameter of the contact ball 64 will be dependent on the diameter of the bonding wire 58, with from 1.5 to 4 times the diameter of the bonding wire 58 being representative.

Next, as shown in FIG. 2E, an alignment step can be performed in which the bonding capillary 54 is aligned with the via 28. The alignment step can be performed using an automated alignment system 82 (FIG. 2D) of the wire bonder 52 (FIG. 2D). In addition, the semiconductor wafer 46 (FIG. 3A) with the semiconductor substrates 12 thereon, can be placed on a work holder 68 (FIG. 2E) of the wire bonder 52 (FIG. 2D). During the alignment step, the position of the via 28 (FIG. 2E) can be ascertained by the automated alignment system 82 of the wire bonder 52, and the bonding capillary 54 can be moved in x and y directions, such that the center of the contact ball 64 aligns with the longitudinal axis 70 (FIG. 2E) of the via 28. Also during the alignment step, the bonding capillary 54 can be operated to position the bonding wire 58 such that a terminal portion of the bonding wire 58 has a desired tail length TL (FIG. 2E). The tail length TL can be selected to be slightly greater (e.g., 1 to several microns) than the depth D (FIG. 2B) of the via 28 (FIG. 2E).

Next, as shown in FIG. 2F, a, placing step can be performed in which the bonding capillary 54 is moved in a z-direction, as indicated by arrow 76, to place the tail length TL of the bonding wire 58 into the via 28. In addition, the placing step can be performed such that the contact ball 64 contacts a bottom surface 74 (FIG. 2F) of the via 28. During the placing step, the vent 50 (FIG. 2F) helps to maintain a positive air or gas flow through the via 28, which facilitates placement of the tail length TL (FIG. 2E) of the bonding wire 58 into the via 28. In addition, the vent 50 can be formed with a surface which seats the contact ball 64 on the bottom surface 74 (FIG. 2F) of the via 28. As an alternative to moving the bonding capillary 54 (FIG. 2F) in the z-direction, the placing step can be performed by maintaining the bonding capillary 54 in a stationary position over the via 28, and then spooling the bonding wire 58 into the via 28.

Next, as shown in FIG. 2G, a looping step can be performed in which the wire clamps (not shown) of the wire bonder 52 (FIG. 2D) are opened, and the bonding capillary 54 is moved in x and z directions (and also in the y direction if required) into a position on the substrate contact 20 for making the bonded connection 42 (FIG. 2H). The looping step can be performed using the alignment system 82 (FIG. 2D) of the wire bonder 52 (FIG. 2D). In this case, the controller 80 (FIG. 2D) of the wire bonder 52 (FIG. 2D) can be loaded with information on the desired locations of the bonded connections 42 (FIG. 2H).

Next, as shown in FIG. 2H, a bonding step can be performed in which the bonded connection 42 is formed on the substrate contact 20. In the illustrative embodiment, the bonded connection 42 comprises a ball bond formed using thermosonic by the bonding capillary 54. Alternately, as will by further explained, the bonded connection 42 can comprise a wedge bond, a ribbon wire bond, or a flanged portion of the bonding member 32. The bonded connection 42 can also comprise a reflow, welded, metallurgical, mechanical or polymer connection formed using any suitable process known in the art.

Next, as shown in FIGS. 2I and 2J, a severing step can be performed in which the wire clamps of the wire bonder 52 (FIG. 2D) are closed, and the bonding capillary 54 is moved as indicated by arrow 84 (FIG. 2I) to sever the bonding wire 58 from the bonded connection 42. FIG. 2J illustrates the resultant wire 30 of the through wire interconnect 14 (FIG. 1D). The wire 30 (FIG. 2J) includes the first end 38 (FIG. 2J) having the bonded connection 42 (FIG. 2J) in the form of a ball bond on the substrate contact 20. The wire 30 (FIG. 2J) also includes the second end 40 (FIG. 2J) having a contact in the form of the contact ball 64, which is preferably seated in the via 28 in contact with the bottom surface 74 thereof.

Next, as shown in FIG. 2K, a dielectric fill step can be performed in which the dielectric material 36 is deposited into the via 28 in viscous form and then cured to harden. The dielectric material 36 can comprise an electrically insulating curable polymer, such as a polyimide, an epoxy or a silicone. Also, the dielectric material 36 (FIG. 2K) can include fillers, such as silicates, configured to reduce the coefficient of thermal expansion (CTE) and adjust the viscosity of the dielectric material. Suitable curable polymers are manufactured by Shinitsu of Japan, and Dexter Electronic Materials of Rocky Hill, Conn. Following curing, the dielectric material 36 (FIG. 2K) provides a potting structure which secures and electrically insulates the wire 30 in the via 28.

The dielectric material 36 (FIG. 2K) can be injected into the via 28 in a viscous state, pulled by capillary action by vacuum directed through the vent 50, and then cured. For example, a positive displacement mechanism such as a syringe, can be used to dispense a quantity of the dielectric material 36 (FIG. 2K) into the via 28. One suitable nozzle deposition apparatus, also known as a material dispensing system, is manufactured by Asymtek of Carlsbad, Calif. Other suitable deposition processes for depositing the dielectric material 36 (FIG. 2K) into the via 28 include screen printing, stenciling and stereographic lithography.

Next, as shown in FIG. 2L, a dielectric removal step can be performed to substantially remove the dielectric material 36 from the substrate contact 20. The dielectric removal step can be performed using an etch process, such as reactive ion etching (RIE), plasma etching or wet etching. With an etch process an etchant, strips or cleans the excess dielectric material 36 from the substrate contact 20.

Next, as shown in FIG. 2M, a bonding member forming step can be performed in which the bonding member 32 is formed on the substrate contact 20 and on a portion of the wire 30. The bonding member forming step can be performed to position the bonding member 32 on a desired portion of the substrate contact 20. In addition, the bonding member 32 can be offset with respect to the via 28 or centered on the via 28.

As another alternative, and as shown in FIGS. 1E and 1F, a bonding member 32A can cover the entire substrate contact 20.

Preferably, the bonding member 32 (FIG. 2M) comprises a non oxidizing easily bondable material, such as gold or platinum. The bonding member 32, in addition to providing an external bonding element for the through wire interconnect 14 (FIG. 1D), also secures the wire 30 in the via 28, and provides a security bond for the bonded connection 42. In the illustrative embodiment, the bonding member 32 comprises a stud bump or a ball bump, formed using a wire bonder, a stud bumper or a ball bumper. For example, a bonding capillary similar to the bonding capillary 54 can be used to form a stud bump. As another example, a suitable stud bumper is a "WAFER PRO PLUS" high speed large area stud bumper manufactured by Kulicke & Soffa Industries Inc. of Willow Grove, Pa. As another example, suitable solder ball bumpers are manufactured by Pac Tech Packaging Technologies of Falkensee, Germany.

In the embodiment illustrated in FIG. 2M, the bonded connection 42 has been made, and the bonding member 32 has been placed on the bonded connection 42. However, the bonding member 32 can also be bonded to the substrate contact 20 first, and then the end 38 of the wire 30 bonded to the bonding member 32 second. In the case, the bonded connection 42 can also be located on any portion of the bonding member 32, such as on the top surface thereof, rather than on the lower surface thereof as in FIG. 2M. The through wire interconnect 14D (FIG. 1K) illustrates one such arrangement wherein the bonded connection 42D is formed on the bonding member 32D. Double bumping or stacked bumping techniques can also be used to form the bonding member 32. For example, the through wire interconnect 14E (FIG. 1L) illustrates the double bump bonding member 32E (FIG. 1L).

Next, as shown in FIG. 2N, a backside thinning step can be performed in which the semiconductor substrate 12 is thinned from the back side 18, such that the via 28 is opened, and the contact ball 64 is exposed. In general, the backside thinning step can be performed to expose any portion of the wire 30 which can be used as a contact for making an electrical connection from the outside to the through wire interconnect 14. The backside thinning step can be performed such that the thinned substrate 12 has a thickness of T. A representative range for the thickness T can be from about 10 μm to 725 μm. During the thinning step, and in subsequent steps to follow, the semiconductor wafer 46 (FIG. 3A) can be mounted in a temporary carrier (not shown). For example, temporary carriers made of glass can be fused by heat and adhesives to the semiconductor wafer 46 (FIG. 3A) to protect the circuit side 16 (FIG. 3A) of the semiconductor substrate 12. Suitable, temporary carriers are manufactured by 3-M Corporation of St. Paul, Minn., and others as well. As another alternative, for some steps of the method, the circuit side 16 of the wafer 46 (FIG. 3A) can be protected by a removable material such as a tape or mask material applied to the semiconductor wafer 46.

The backside thinning step of FIG. 2N, can be performed using a chemical mechanical planarization (CMP) apparatus. One suitable CMP apparatus is manufactured by "ACCRETECH" of Tokyo, Japan, and is designated a model no. "PG300RM". Suitable CMP apparatus are also commercially available from Westech, SEZ, Plasma Polishing Systems, TRUSI and other manufacturers. The backside thinning step can also be performed using an etching process, such as a wet etching process, a dry etching process or a plasma etching process. As another alternative, a combination of planarization and etching can be performed. For example, a mechanical grinder can be used to remove the bulk of the material, followed by etching to remove grind damage. U.S. Pat. No. 6,908,784, which is incorporated herein by reference, further describes processes and equipment for performing the backside thinning step.

Next, as shown in FIG. 2O, an optional back side insulating step can be performed in which an insulating layer 86 is formed on the thinned backside 18 of the semiconductor substrate 12. The insulating layer 86 can comprise a polymer layer such as polyimide or parylene, a glass such as BPSG, or an oxide such as silicon dioxide. In addition, the insulating layer can be formed using a suitable deposition process such as CVD, screen printing or taping. Further, the insulating layer 86 includes openings 88 which align with the contact balls 64.

Next, as shown in FIG. 2P, an optional polymer button forming step can be performed in which polymer buttons 90 are formed on the contact balls 64. The button forming step can be performed using a suitable polymer, such as a silicone, a polyimdie or an epoxy, and a process such as nozzle deposition or screen printing. Depending on the application, the polymer buttons 90 (FIG. 2P) can provide electrical insulation and protection, an adhesive connection, or an electrical connection. If no electrical contact is made to the contact ball 64 (FIG. 2P), the polymer buttons 90 can comprise an electrically insulating material. Alternately, the polymer buttons 90 (FIG. 2P) can comprise an electrically conductive material, such as an anisotropic adhesive. The adhesive buttons 90 can also comprise an adhesive material for applications such as stacking and surface mounting.

Next, a singulating step, such as sawing, scribing, liquid jetting, or laser cutting through a liquid, can be performed to singulate a chip scale semiconductor component 92 (FIG. 4A) from the wafer 46. Alternately, a wafer sized component can be provided which contains multiple unsingulated semiconductor substrates 12.

Figure 2Q:
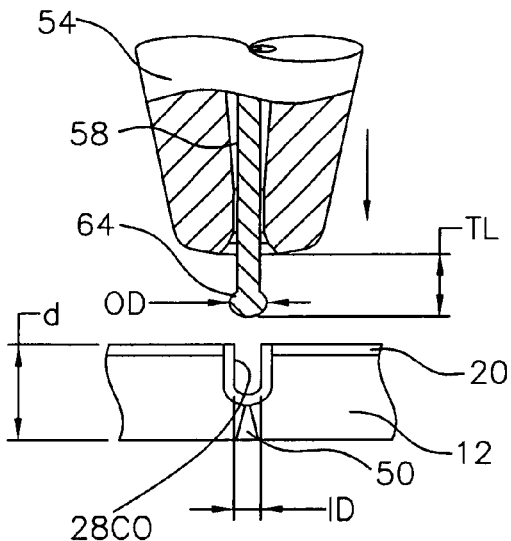

Referring to FIGS. 2Q-2T, steps in a method for forming the compressed wire through wire interconnect 14C (FIG. 1J) are illustrated. Initially, as shown in FIG. 2Q, the substrate 12, the substrate contact 20 and the bonding capillary 54 are provided, as previously described. In addition, the via 28CO is formed in the substrate 12 as previously described. However, in this case the depth d of the via 28CO is very small, on the order of from 10 μm to 125 μm. Preferably, the outside diameter OD of the contact ball 64 of the bonding wire 58 is approximately equal to the depth d of the via 28CO, and to the inside diameter ID of the via 28CO. In this embodiment, it is preferable to compress the contact ball 64 into the via 28CO, and to fill the via 28CO with the metal of the contact ball 64.

Figure 2R:
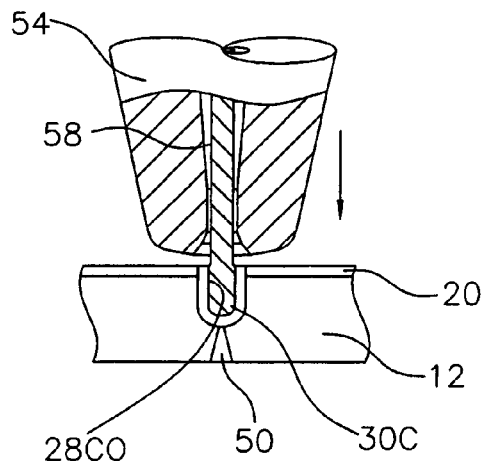
Figure 2S:
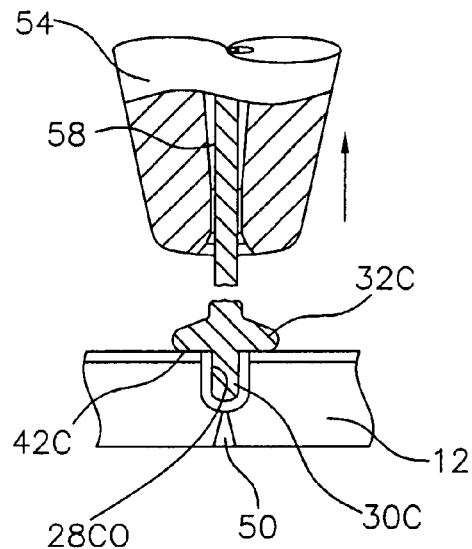
Figure 2T:
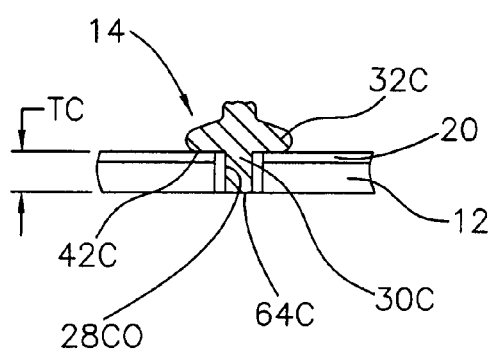

Next, as shown in FIGS. 2R and 2S, the bonding capillary 58 is operated to compress the contact ball 64 and the bonding wire 58 into the via 28CO, forming the compressed wire 30C, the bonded connection 42C (FIG. 2S) and the bonding member 32C (FIG. 2S). As shown in FIG. 2T, following a substrate thinning step as previously described, the contact 64C on the compressed wire 30C is exposed. Alternately, rather than using the bonding capillary 54, the compressed through wire interconnect 14C can be fabricated by depositing a metal into the via 28CO and then compressing the metal using a tamping tool.

As shown in FIG. 4A, a chip scale semiconductor component 92 includes the semiconductor substrate 12 having a plurality of through wire interconnects 14, which correspond to the locations of the substrate contacts 20. The substrate contacts 20 can have any desired configuration including dense area arrays, such as edge arrays, center arrays, or perimeter arrays. The through wire interconnects 14 can be used as terminal contacts, which can be surface mounted to a supporting substrate, or stacked to other components. In addition, the bonding members 32 provide electrical connection points proximate to the circuit side 16, and the contact balls 64 provide electrical connection points proximate to the back side 18 of the semiconductor substrate 12.

Referring to FIG. 4B, a stacked semiconductor component 94 includes the semiconductor component 92, and a bumped semiconductor die 96 stacked on the semiconductor component 92. The bumped semiconductor die 96 can comprise a full or partial thickness die, having a plurality of bumped contacts 98 (e.g., stud bumps or ball bumps) on a circuit side 102 thereof, in electrical communication with the integrated circuits contained on the semiconductor die 96. In addition, the bumped contacts 98 can be arranged in an area array, which corresponds to the area array of the through wire interconnects 14 on the semiconductor component 92. Further, the bumped contacts 98 can be bonded to the contact balls 64 of the through wire interconnects 14 on the semiconductor component 92.

The bumped contacts 98 (FIG. 4B) can comprise a bondable metal such as gold, platinum or solder, or a conductive polymer, such as metal filled epoxy, which can be bonded to the contact balls 64 using a suitable process such as diffusion bonding, thermal bonding or reflow bonding. For example, the bumped contacts 98 can comprise gold stud bumps, and the contact balls 64 can comprise gold free air balls, such that a gold to gold diffusion bond can be formed. Further, an adhesive layer 100 (FIG. 4B), such as a curable polymer underfill material, adhesively bonds the circuit side 102 (FIG. 4B) of the semiconductor die 96 (FIG. 4B) to the back side insulating layer 86 on the semiconductor component 92.

The stacked semiconductor component 94 (FIG. 4B) can be fabricated at the wafer level with a plurality of semiconductor dice 96 contained on a wafer, and the singulated components 92 then bonded to the semiconductor dice 96 on the wafer. In this case, a die attacher or an aligner bonder could be employed to place and bond the semiconductor components 92 to the semiconductor dice 96 contained on the wafer. In addition, the components 92 can be tested prior to the bonding process and certified as known good components (KGC) to improve the yield of the bonding process. Following the bonding process, the stacked semiconductor components 94 could be singulated from the wafer containing the semiconductor dice 96 with the semiconductor component 92 bonded thereto. Alternately, the semiconductor dice 96 and the semiconductor components 92 could both be singulated components. As another alternative, a wafer to wafer fabrication process could be employed wherein both the semiconductor dice 96 and the semiconductor components 92 are contained on mating wafers.

As mentioned previously, at least some of the substrate contacts 20 (FIG. 4B) on the stacked semiconductor component 94 (FIG. 4B) can be electrically isolated, and not in electrical communication with the integrated circuits 22 (FIG. 1D) on the semiconductor substrate 12. In this case, electrical signals can be transmitted through the stacked semiconductor component 94 (FIG. 4B) without adding unwanted inductance or capacitance. For example, the semiconductor substrate 12 (FIG. 4B) of the semiconductor component 92 (FIG. 4B) can comprise a dynamic random access memory (DRAM). The DQ circuits on some DRAM's have up to 1 pf of capacitance added into the DQ circuits, to help offset the inductance added to the DRAM by wire bonds. In general, wire bonds have a high inductance but very low capacitance.

In the stacked component 94 (FIG. 4B) capacitance could potentially be added each time a signal is transmitted through a substrate contact 20 (FIG. 4B) associated with a DQ circuit. Similarly, noise, bleed off voltage, and bleed off current could potentially be added to the signals transmitted through the through wire interconnects 14 (FIG. 4B). However, if selected substrate contact 20 are electrically isolated from the integrated circuits 22 (FIG. 1D) as required, parasitics could be reduced. One method for electrically isolating a substrate contact 20 (FIG. 4B) would be to etch or laser machine a trench around the perimeter of the substrate contact 20 (FIG. 4B). Another method would be to incorporate programmable links, such as fuses, antifuses or gates, between the substrate contacts 20 (FIG. 1D) and the integrated circuits 22 (FIG. 1D). Yet another method would be to design and fabricate the substrate contact 20 as an electrically isolated pass through contact for stacking applications.

Figure 5:
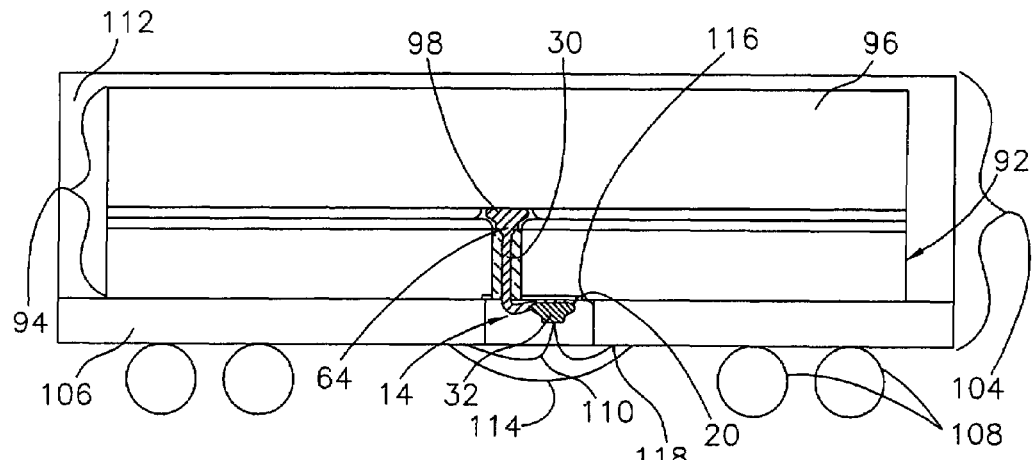
FIG. 5 is a schematic cross sectional view of a stacked wire bonded FBGA semiconductor component constructed using the stacked semiconductor component of FIG. 4B.

Referring to FIG. 5, a wire bonded fine ball grid array (FBGA) semiconductor component 104 includes the stacked semiconductor component 94 wire bonded in a board on chip (BOC) configuration to a package substrate 106. The package substrate 106 includes a plurality of terminal contacts 108, such as solder balls, in a fine ball grid array. The terminal contacts 108 are in electrical communication with wire bonding pads 118 on the package substrate 106. In addition, the package substrate 106 includes a wire bonding opening 116, and a plurality of wires 110 that are wire bonded to the wire bonding pads 118 on the package substrate 106, and to the bonding members 32 on the through wire interconnects 14 of the semiconductor component 92. The wire bonded fine ball grid array (FBGA) semiconductor component 104 also includes a package encapsulant 112 on the package substrate 106, which encapsulates the stacked semiconductor component 94, and a wire bond encapsulant 114, which encapsulates the wires 110 and associated wire bonds.

Figure 6:
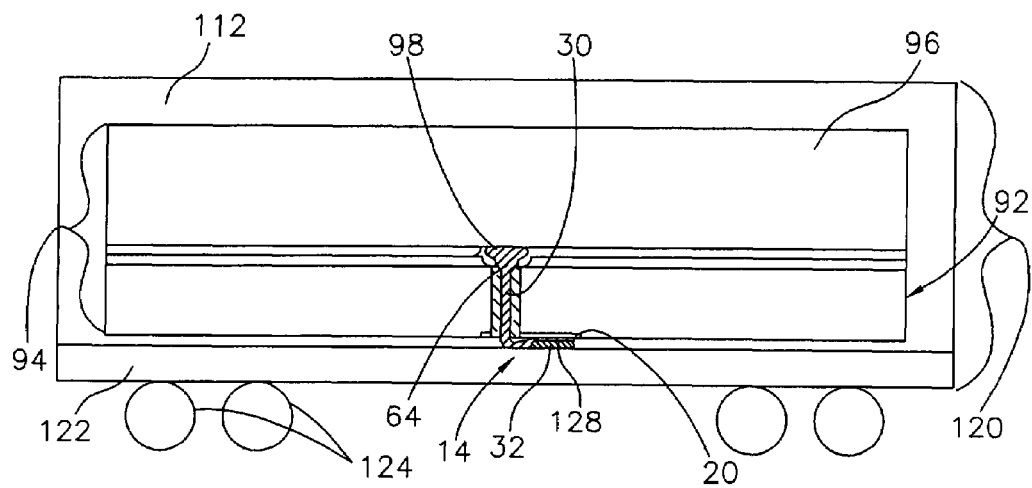
FIG. 6 is a schematic cross sectional view of a stacked flip chip bonded FBGA semiconductor component constructed using the stacked semiconductor component of FIG. 4B.

Referring to FIG. 6, a flip chip bonded (FCIP) fine ball grid array (FBGA) semiconductor component 120 includes the stacked semiconductor component 94 flip chip bonded in a chip on board (COB) configuration to a package substrate 122. The package substrate 122 includes a plurality of terminal contacts 124, such as solder balls, in a fine ball grid array. The terminal contacts 124 are in electrical communication with flip chip bonding pads 128 on the package substrate 122. In addition, the bonding members 32 on the through wire interconnects 14 of the semiconductor component 92 are flip chip bonded to the flip chip bonding pads 128 on the package substrate 122. The semiconductor component 120 also includes the package encapsulant 112 on the package substrate 122, which encapsulates the stacked semiconductor component 94.

Figure 7:
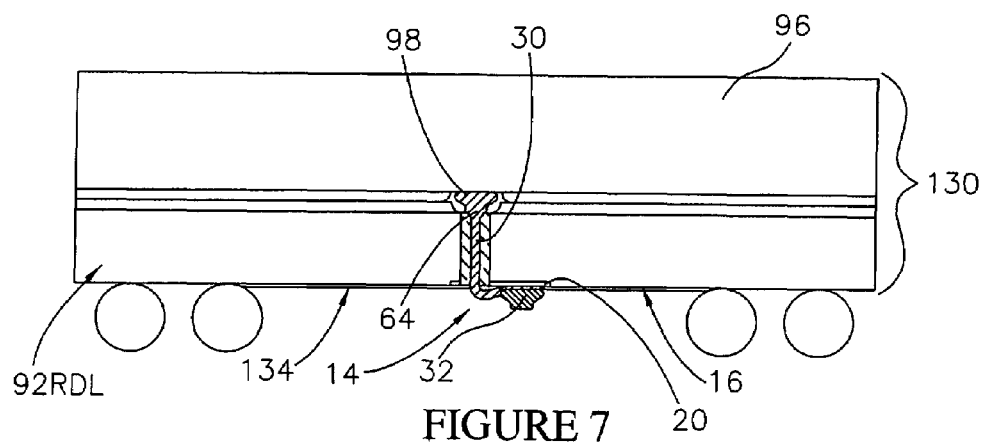
FIG. 7 is a schematic cross sectional view of a stacked redistribution layer (RDL) chip scale (CSP) semiconductor component constructed using the stacked semiconductor component of FIG. 4B with an added RDL layer.

Referring to FIG. 7, a redistribution layer (RDL) chip scale (CSP) semiconductor component 130 is substantially similar to the stacked semiconductor component 94 (FIG. 4B). However, the redistribution layer (RDL) chip scale (CSP) semiconductor component 130 also includes terminal contacts 132, such as solder balls in an area array. The terminal contacts 132 are in electrical communication with redistribution layer conductors 134 formed on the circuit side 16 of a semiconductor component 92RDL. The semiconductor component 92RDL is substantially similar to the semiconductor component 92 (FIG. 4A) but also includes the redistribution layer conductors 134 in electrical communication with the bonding members 32 of the through wire interconnects 14. The redistribution layer conductors 134 can be fabricated at the wafer level on the semiconductor wafer 46 (FIG. 3A) containing the semiconductor component 92.

Figure 8:
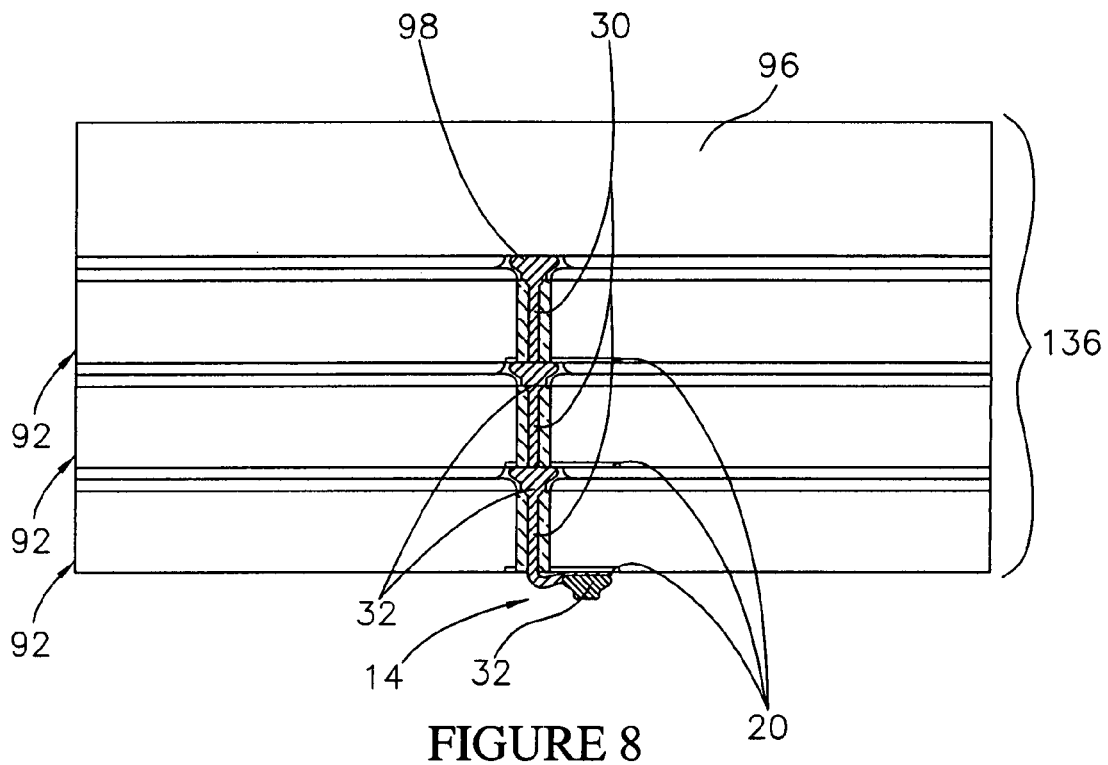
FIG. 8 is a schematic cross sectional view of a four die stacked semiconductor component.

Referring to FIG. 8, a four die stacked semiconductor component 136 is substantially similar to the stacked semiconductor component 94 (FIG. 4B). However, in this case the through wire interconnects 14 on three of the semiconductor components 92 are stacked in a three die stack. In addition, the three die stack is bonded to the bumped semiconductor die 96. In the middle components 92, the bonding members 32 and the vias 28 are centered on the substrate contacts 20 rather than being offset, substantially as previously described and shown in FIG. 3C.

Figure 9:
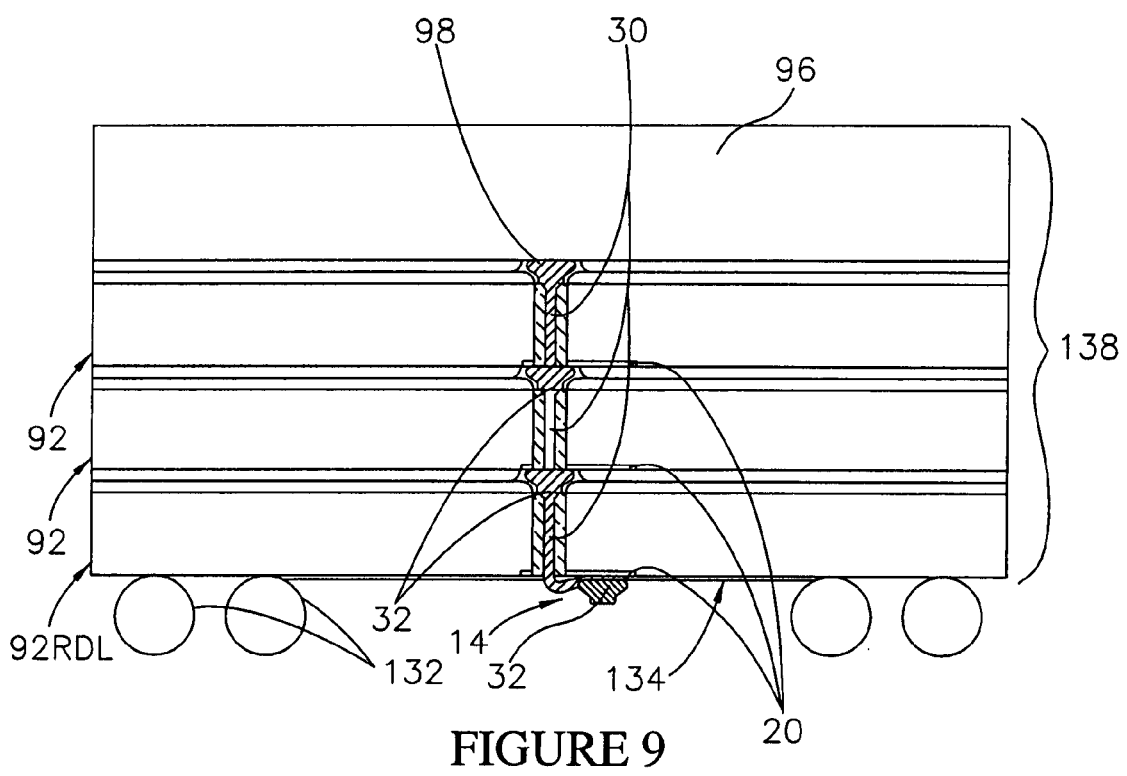
FIG. 9 is a schematic cross sectional view of a four die stacked redistribution layer (RDL) chip scale (CSP) semiconductor component.

Referring to FIG. 9, a four die RDL semiconductor component 138 is substantially similar to the RDL CSP semiconductor component 130 (FIG. 7). However, in this case the through wire interconnects 14 on two additional semiconductor components 92 are stacked to the semiconductor component 92RDL in a three die stack substantially as described for semiconductor component 136 (FIG. 8).

Figure 10:
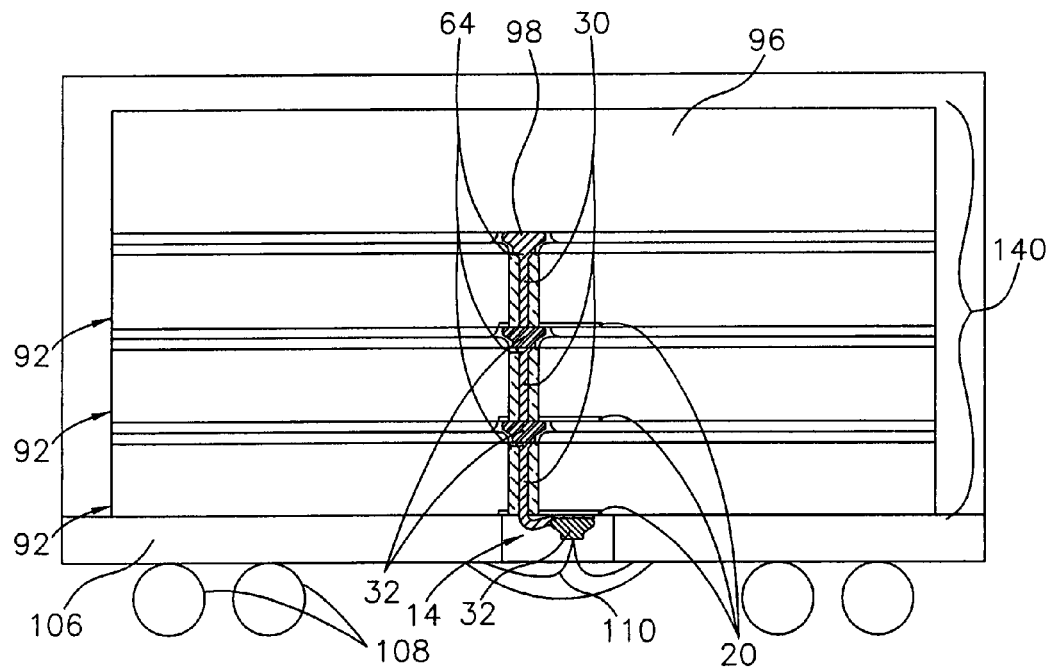
FIG. 10 is a schematic cross sectional view of a four die wire bonded stacked semiconductor component constructed.

Referring to FIG. 10, a four die wire bonded FBGA semiconductor component 136 is substantially similar to the wire bonded FBGA semiconductor component 104 (FIG. 5). However, in this case the through wire interconnects 14 on three of the semiconductor components 92 are stacked in a three die stack substantially as described for semiconductor component 136 (FIG. 8). In addition, the three die stack is wire bonded to the package substrate 106.

Figure 11:
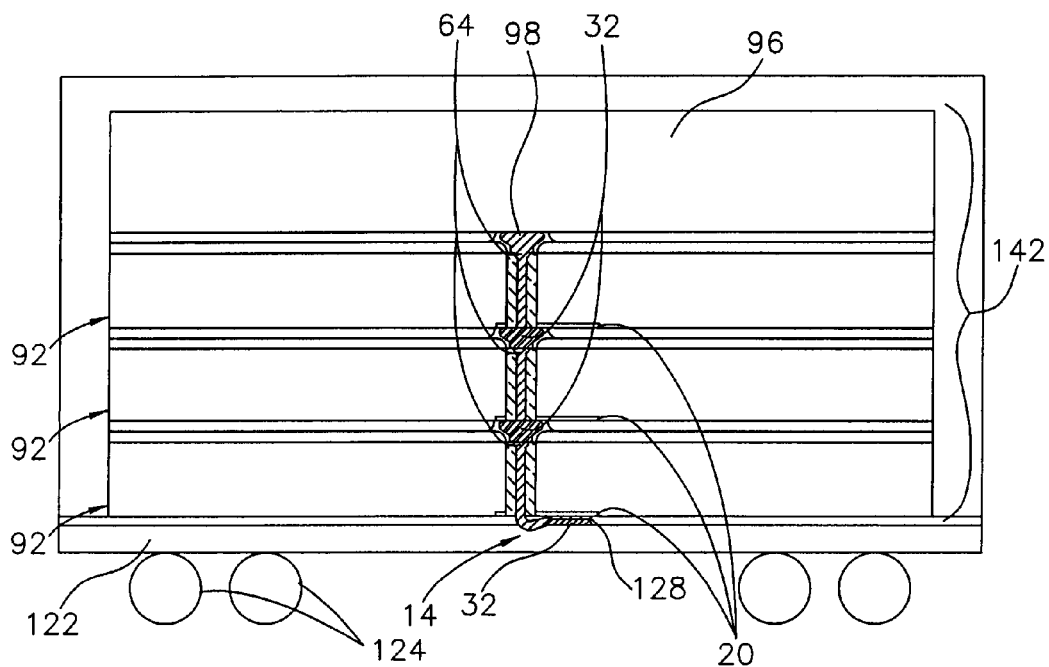
FIG. 11 is a schematic cross sectional view of a four die stacked flip chip bonded semiconductor component.

Referring to FIG. 11, a four die flip chip bonded FBGA semiconductor component 142 is substantially similar to the flip chip bonded FBGA semiconductor component 120 (FIG. 6). However, in this case the through wire interconnects 14 on the stacked semiconductor components 92 are stacked substantially as described for semiconductor component 136 (FIG. 8). In addition, the lowermost semiconductor component 92 is flip chip bonded to the package substrate 122.

Figure 12:
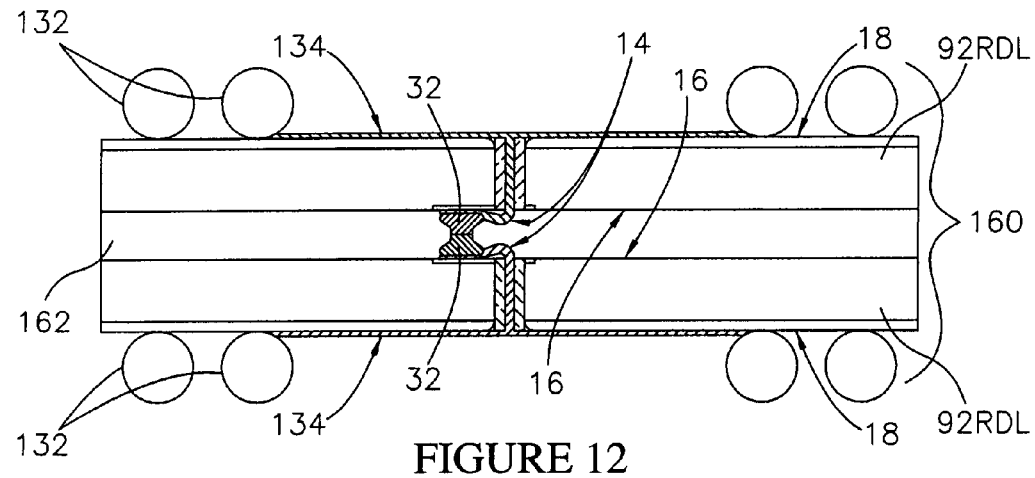
FIG. 12 is a schematic cross sectional view of a two die stacked face to face semiconductor component with terminal contacts on opposing sides.

Referring to FIG. 12, a face to face stacked semiconductor component 160 is illustrated. The face to face stacked semiconductor component 160 includes a pair of RDL semiconductor components 92RDL having the bonding members 32 of their through wire interconnects 14 bonded to one another in a face to face configuration. In addition, an underfill layer 162 is formed between the circuit sides 16 of the RDL semiconductor components 92RDL for encapsulating and electrically insulating circuit sides and the bonded bonding members 32. Further, terminal contacts 132 and RDL conductors 134 are formed on opposing back sides 18 of the RDL semiconductor components 92RDL. The face to face stacked semiconductor component 160 thus includes terminal contacts 132 on opposing sides, which permits stacking or surface mounting from either side.

Figure 13:
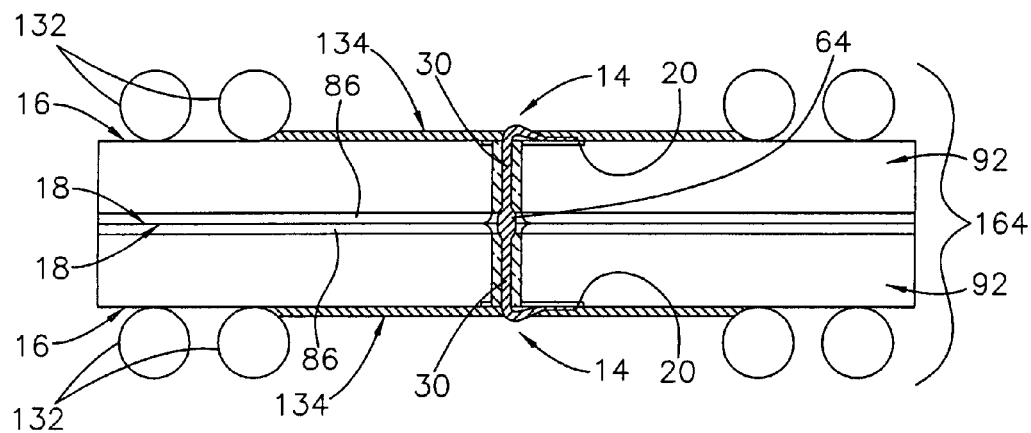
FIG. 13 is a schematic cross sectional view of a two die stacked back to back semiconductor component with terminal contacts on opposing sides.

Referring to FIG. 13, a back to back stacked semiconductor component 164 is illustrated. The back to back stacked semiconductor component 164 includes a pair of semiconductor components 92 having their back sides 18 bonded to one another using a suitable adhesive or underfill layer, substantially as previously described for the underfill layer 162 in FIG. 12. In addition, the ball contacts 64 on the wires 30 of the through wire interconnects 14 of the semiconductor components 92, are bonded to one another using a suitable bonding technique, such as a gold to gold diffusion bond substantially as previously described. Further, terminal contacts 132 and RDL conductors 134 are formed on the circuit sides 16 of the semiconductor components 92 in electrical communication with the wires 30 of the through wire interconnects 14. In this embodiment, the bonding members 32 are omitted, but could also be included, and placed in electrical communication with the RDL conductors 134 and the terminal contacts 132. The back to back stacked semiconductor component 164 thus includes terminal contacts 132 on opposing sides, which permits stacking or surface mounting from either side.

Figure 14:
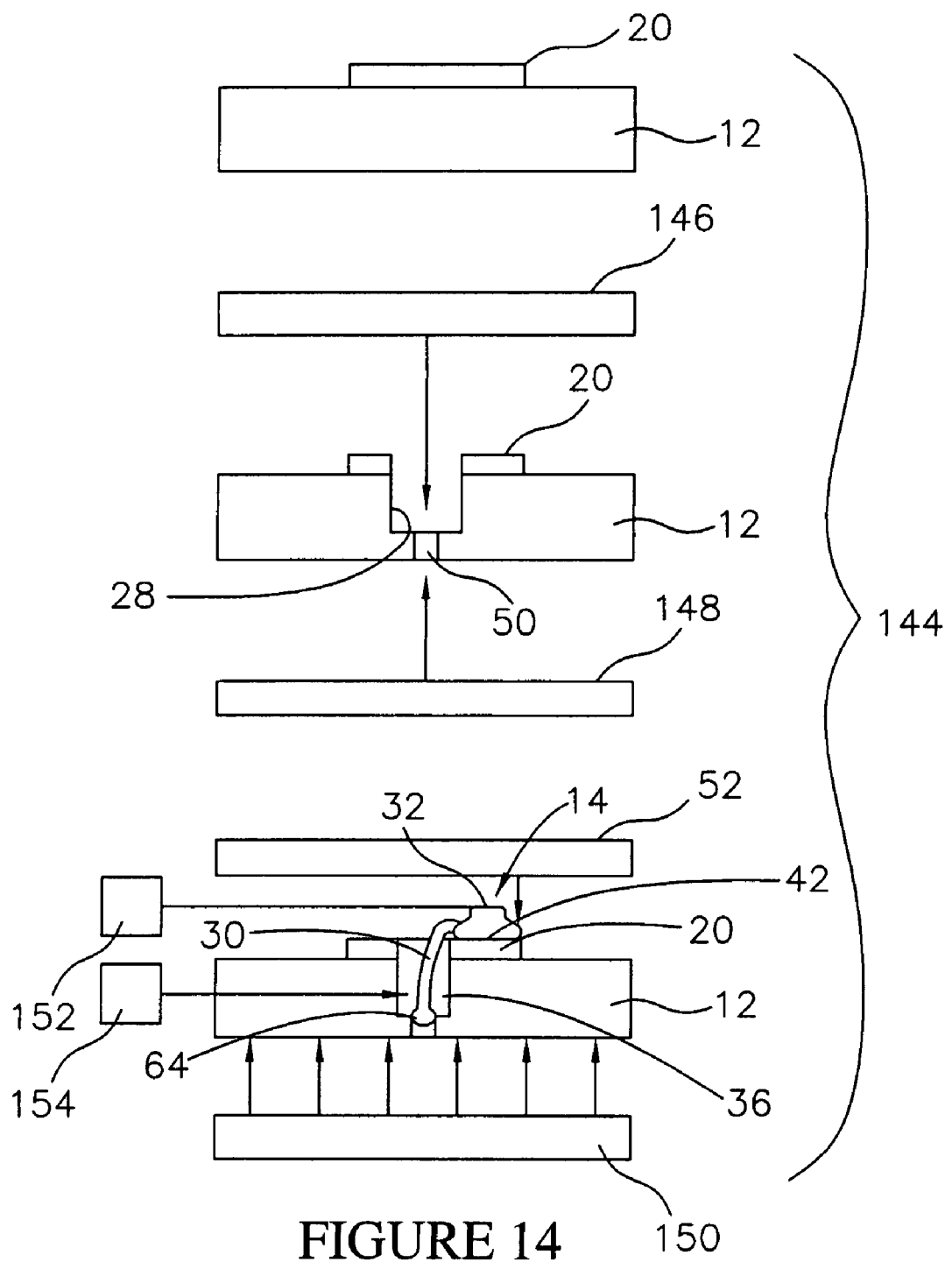
FIG. 14 is a schematic view illustrating a system for fabricating semiconductor components with through wire interconnects.

Referring to FIG. 14, a system 144 for forming the through wire interconnect 14 in accordance with the method is illustrated. The system 144 includes the semiconductor substrate 12 and the substrate contact 20 on the substrate 12. The system 144 also includes an etching system 146 configured to form the via 28 through the substrate contact 20 and part way through the substrate 12. The system 144 also includes a vent forming system 148 such as a laser machining system or an etching system configured to form the vent 50. The system 144 also includes the wire bonder 52 configured to form the contact ball 64, to place the wire 30 in the via 28 and to form the bonded connection 42 between the wire 30 and the substrate contact 20. The system 144 also includes a dielectric dispensing system 154, such as a material dispensing system or screen printer, configured to dispense the dielectric material 36 into the via 28. The system 144 also includes a bonding member forming system 152, such as a stud bumper or a ball bonder, configured to form the bonding member 32 on the wire 30 and the substrate contact 20. The system 144 also includes a thinning system 150, such as a chemical mechanical planarization (CMP) system or etching system, configured to thin the substrate 12 from the backside 18 to expose the via 28 and the contact ball 64.

Thus the invention provides improved semiconductor components, and methods and systems for fabricating the semiconductor components. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a substrate having a first side and a second side;
   forming a via on the first side part way through the substrate;
   placing a wire in the via;
   bonding a first end of the wire to the first side of the substrate; and
   thinning the substrate from the second side to expose a second end of the wire.

2. The method of claim 1 wherein the substrate includes a substrate contact on the first side, the via is formed through the substrate contact, and the first end of the wire is bonded to the substrate contact.

3. The method of claim 2 wherein the substrate includes at least one circuit in electrical communication with the substrate contact.

4. The method of claim 3 further comprising forming a bonding member on the wire and the substrate contact.

5. The method of claim 4 further comprising stacking a second substrate on the substrate having a second contact bonded to the bonding member.

6. The method of claim 5 further comprising stacking a second substrate on the substrate in a face to face configuration having a second bonding member bonded to the bonding member.

7. The method of claim 5 further comprising stacking a second substrate on the substrate in a back to back configuration having a second wire bonded to the wire.

8. The method of claim 1 further comprising forming an encapsulant in the via.

9. The method of claim 1 wherein the thinning step comprises etching or chemical mechanical planarization.

10. The method of claim 1 wherein the bonding step comprises ball bonding or wedge bonding.

11. The method of claim 1 wherein the wire comprises a ribbon wire and the bonding step comprises ribbon wire bonding.

12. The method of claim 1 wherein the placing the wire step comprises compressing the wire in the via and the bonding step comprises forming a stud bump on the wire.

13. A method for fabricating a semiconductor component comprising:
providing a semiconductor substrate having an integrated circuit and a contact in electrical communication with the integrated circuit;
forming a via in the contact part way through the substrate;
forming a vent from the second side to the via;
placing a wire in the via;
bonding the wire to the contact; and
thinning the substrate to expose the via and at least a portion of the wire.

14. The method of claim 13 further comprising forming a bonding member on the contact and the wire.

15. The method of claim 13 wherein the placing step and the bonding step are performed using a bonding capillary.

16. The method of claim 13 wherein the via includes an insulating layer.

17. The method of claim 13 further comprising depositing a dielectric material in the via and around the wire.

18. The method of claim 13 further comprising forming a bonding member on the wire and on the contact.

19. The method of claim 13 wherein the wire includes a contact ball on the second end.

20. The method of claim 13 wherein the wire includes a planar surface on the second end.

21. The method of claim 13 wherein bonding step comprises ball bonding or wedge bonding.

22. The method of claim 13 wherein the wire comprises a ribbon wire and the bonding step comprises ribbon wire bonding.

23. The method of claim 13 wherein the placing the wire step comprises compressing the wire in the via and the bonding step comprises forming a stud bump on the wire.

24. A method for fabricating a semiconductor component comprising:
providing a semiconductor substrate having a circuit side, a back side, an integrated circuit, and a substrate contact in electrical communication with the integrated circuit;
forming a via through the substrate contact and in the semiconductor substrate and a vent in the via;
placing a wire in the via having a contact thereon;
forming a bonded connection between the wire and the substrate contact;
forming a bonding member on the wire and the substrate contact; and
thinning the substrate from the back side to expose the contact.

25. The method of claim 24 further comprising forming an encapsulant in the via encapsulating the wire.

26. The method of claim 24 wherein the bonding member comprises a stud bump or a ball bump.

27. The method of claim 24 further comprising forming a conductor on the circuit side in electrical communication with the bonded contact, and a terminal contact on the circuit side in electrical communication with the conductor.

28. The method of claim 24 wherein the forming the via step forms the via part way through the substrate and the placing step compresses the wire in the via and forms the bonding member as a stud bump.

29. A method for fabricating a semiconductor component comprising:
providing a first semiconductor substrate having a first side, a substrate contact on the first side, a thinned second side, and a via extending through the substrate contact from the first side to the thinned second side;
providing a through wire interconnect on the first substrate comprising a wire in the via, a contact on the wire proximate to the thinned second side, a bonded connection between the wire the substrate contact, and a bonding member on the wire and the substrate contact; and
stacking a second semiconductor substrate on the first semiconductor substrate having a second contact bonded to the bonding member.

30. The method of claim 29 wherein the first substrate comprises a thinned semiconductor die.

31. The method of claim 29 wherein the second substrate comprises a semiconductor die and the second contact comprises a stud bump, a ball bond or a solder ball.

32. The method of claim 29 wherein the first semiconductor substrate and the second semiconductor substrate are stacked in a face to face configuration and the second contact comprises a second bonding member on a second through wire interconnect.

33. A system for fabricating a semiconductor component comprising:
a semiconductor substrate having a first side, a second side, a substrate contact on the first side, and a via extending through the substrate contact and at least part way through the substrate; and
at least one bonding capillary configured to place a selected length of a wire into the via, to form a bonded connection between the wire and the substrate contact, and to sever the wire.

34. The system of claim 33 further comprising a thinning apparatus configured to thin the substrate from the second side to expose a contact on the wire.

35. The system of claim 34 wherein the thinning apparatus comprises a chemical mechanical planarization (CMP) apparatus.

36. The system of claim 33 wherein the bonding capillary comprises an element of a wire bonder.

37. The system of claim 33 wherein the wire comprises a ribbon wire and the bonding capillary comprises a ribbon wire bonded.

38. The system of claim 33 further comprising a bonding member forming apparatus configured to form a bonding member on the wire and the substrate contact.

39. The system of claim 33 further comprising a stud bumper configured to form a stud bump on the wire and the substrate contact.

40. The system of claim 33 further comprising an etching apparatus configured to etch the substrate from the first side to form the via.

41. The system of claim 33 further comprising a laser machining apparatus configured to form a vent in the via.

42. The system of claim 33 further comprising a dielectric dispensing apparatus configured to dispense a dielectric material in the via.

43. The system of claim 33 wherein the bonding capillary is configured to form a ball bond or a wedge bond.

44. The system of claim 33 wherein the bonding capillary is configured to compress the wire in the via and to form the bonded connection as a stud bump.

45. The system of claim 33 wherein the bonding capillary is configured to form the contact as a free air ball.

46. The system of claim 33 wherein the substrate comprises a semiconductor die having at least one integrated circuit in electrical communication with the substrate contact.

47. The system of claim 33 wherein the substrate comprises a semiconductor die contained on a semiconductor wafer.

48. The system of claim 33 wherein the via comprises an electrically insulating layer.

49. The system of claim 33 wherein the wire includes an electrically insulating layer.

50. A method for fabricating a semiconductor component having a semiconductor substrate comprising:
- forming a via on a first side of the substrate part way through the substrate;
- placing a wire in the via;
- bonding a first end of the wire to the first side of the substrate; and
- thinning a second side of the substrate to expose a second end of the wire.

51. The method of claim 50 wherein the substrate includes at least one integrated circuit in electrical communication with the wire.

52. A method for fabricating a semiconductor component having a semiconductor substrate, a first side, a second side, and a substrate contact of the first side comprising:
- forming a via in the substrate;
- placing a wire in the via having a contact therein;
- forming a bonded connection between the wire and the substrate contact; and
- exposing the contact by thinning the substrate.

53. The method of claim 52 wherein the substrate includes at least one integrated circuit in electrical communication with the substrate contact.

54. A method for fabricating a semiconductor component having a semiconductor substrate, a first side, a second side, and a substrate contact on the first side comprising
- forming a via through the substrate contact and in the semiconductor substrate;
- placing a wire in the via;
- forming a bonded connection between the wire and the substrate contact;
- forming a bonding member on the wire and the substrate contact; and
- thinning the substrate from the second side to expose a contact on the wire.

55. The method of claim 54 wherein the thinning step comprises etching or planarization.

56. A method for fabricating a semiconductor component having a semiconductor substrate, an integrated circuit, and a substrate contact in electrical communication with the integrated circuit comprising:
- forming a via through the substrate contact and in the substrate;
- placing a wire in the via;
- forming a bonded connection between the wire and the substrate contact;
- forming a bonding member on the wire and the substrate contact; and
- thinning the substrate to expose at least a portion of the wire.

57. The method of claim 56 further comprising forming an encapsulant in the via encapsulating the wire.

58. The method of claim 56 wherein the thinning step is performed on a semiconductor wafer containing the substrate.

59. The method of claim 56 wherein following the thinning step the substrate has a thickness of from 10 μm to 725 μm.

* * * * *

UNITED STATES PATENT AND TRADEMARK OFFICE
CERTIFICATE OF CORRECTION

PATENT NO. : 7,579,267 B2
APPLICATION NO. : 11/712815
DATED : August 25, 2009
INVENTOR(S) : Alan G. Wood et al.

Page 1 of 1

It is certified that error appears in the above-identified patent and that said Letters Patent is hereby corrected as shown below:

In column 22, line 6, in Claim 29, after "wire" insert -- and --.

In column 22, line 42, in Claim 37, delete "bonded." and insert -- bonder. --, therefor.

In column 23, line 22, in Claim 52, delete "of" and insert -- on --, therefor.

In column 23, line 24, in Claim 52, delete "therein;" and insert -- thereon; --, therefor.

Signed and Sealed this

Twenty-seventh Day of October, 2009

David J. Kappos
*Director of the United States Patent and Trademark Office*